(12) United States Patent
Falster et al.

(10) Patent No.: US 7,521,382 B2
(45) Date of Patent: Apr. 21, 2009

(54) HIGH RESISTIVITY SILICON STRUCTURE AND A PROCESS FOR THE PREPARATION THEREOF

(75) Inventors: Robert J. Falster, London (GB);
Vladimir V. Voronkov, Merano (IT);
Galina I. Voronkova, Merano (IT);
Anna V. Batunina, Moscow (RU)

(73) Assignee: MEMC Electronic Materials, Inc., St. Peters, MO (US)

( * ) Notice: Subject to any disclaimer, the term of this patent is extended or adjusted under 35 U.S.C. 154(b) by 176 days.

(21) Appl. No.: 11/436,688

(22) Filed: May 18, 2006

(65) Prior Publication Data
US 2006/0263967 A1 Nov. 23, 2006

Related U.S. Application Data

(60) Provisional application No. 60/682,691, filed on May 19, 2005.

(51) Int. Cl.
*H01L 21/00* (2006.01)
(52) U.S. Cl. .......... 438/795; 438/798; 257/E21.328
(58) Field of Classification Search ............ 438/795, 438/530, 798, 799; 257/E21.328, E21.333
See application file for complete search history.

(56) References Cited

U.S. PATENT DOCUMENTS

| | | | |
|---|---|---|---|
| 4,342,616 A | | 8/1982 | Elliott et al. |
| 5,385,115 A | * | 1/1995 | Tomioka et al. ........... 117/2 |
| 5,494,849 A | | 2/1996 | Iyer et al. |
| 5,944,889 A | * | 8/1999 | Park et al. ................ 117/94 |
| 5,994,761 A | | 11/1999 | Falster et al. |
| 6,191,010 B1 | | 2/2001 | Falster |
| 6,204,152 B1 | | 3/2001 | Falster |
| 6,236,104 B1 | | 5/2001 | Falster et al. |
| 6,284,384 B1 | | 9/2001 | Wilson et al. |
| 6,336,968 B1 | | 1/2002 | Falster |
| 2003/0032268 A1 | * | 2/2003 | Sadigh et al. ............. 438/530 |
| 2003/0054641 A1 | | 3/2003 | Binns et al. |
| 2003/0106481 A1 | | 6/2003 | Kononchuk et al. |
| 2003/0106482 A1 | | 6/2003 | Kononchuk et al. |

(Continued)

FOREIGN PATENT DOCUMENTS

EP 1501122 1/2005

(Continued)

OTHER PUBLICATIONS

Abe, T., "High Resistivity CZ Silicon for RF Applications Substituting GaAs," *High Purity Silicon VI: Proceedings of the Sixth International Symposium*, 2000, vol. 2000-17, 2000, pp. 491-500.

(Continued)

*Primary Examiner*—Caridad M Everhart
(74) *Attorney, Agent, or Firm*—Armstrong Teasdale LLP

(57) ABSTRACT

The present invention generally relates to a high resistivity CZ silicon wafer, or a high resistivity silicon structure derived therefrom, and a process for the preparation thereof. In particular, the high resistivity silicon structure comprises a large diameter CZ silicon wafer as the substrate thereof, wherein the resistivity of the substrate wafer is decoupled from the concentration of acceptor atoms (e.g., boron) therein, the resistivity of the substrate being substantially greater than the resistivity as calculated based on the concentration of said acceptor atoms therein.

54 Claims, 17 Drawing Sheets

U.S. PATENT DOCUMENTS

| | | | |
|---|---|---|---|
| 2003/0106485 | A1 | 6/2003 | Kononchuk et al. |
| 2003/0106486 | A1 | 6/2003 | Kononchbuk et al. |
| 2003/0109115 | A1 | 6/2003 | Kononchuk et al. |
| 2003/0192469 | A1 | 10/2003 | Libbert et al. |
| 2005/0000410 | A1* | 1/2005 | Takase et al. ............... 117/92 |
| 2005/0020033 | A1* | 1/2005 | Specht et al. ............. 438/478 |
| 2005/0167757 | A1* | 8/2005 | Ohguro ..................... 257/369 |

FOREIGN PATENT DOCUMENTS

| | | |
|---|---|---|
| JP | 63090141 | 4/1988 |
| JP | 05058788 | 7/1993 |

OTHER PUBLICATIONS

Hamel, J. S., et al. "Substrate Crosstalk Suppression Capability of Silicon-on-Insulator Substrates with Buried Ground Planes (GPSOI)," *IEEE Microwave and Guided Wave Letters*, vol. 10, No. 4, 2000, 134-135.

Heinrich, W., et al., "Coplanar Passive Elements on Si Substrate for Frequencies Up To 110 GHz," *IEEE Transactions on Microwave Theory and Techniques*, vol. 46, 1998, pp. 709-712.

Hennel, A., "Transition Metals in III/V Compounds," *Semiconductors and Semimetals*, vol. 38, 1993, pp. 189-234.

Kaiser, W., "Electrical and Optical Properties of Heat-Treated Silicon," *Physical Review*, vol. 105, No. 6, 1957, pp. 1751-1756.

Kaiser, W., et al., "Mechanism of the Formation of Donor States in Heat-Treated Silicon," Physical Review, vol. 112, No. 5, 1958, pp. 1546-1554.

Londos, C. A. et al., "Effect of Oxygen Concentration on the Kinetics of Thermal Donor Formation in Silicon at Temperatures between 350 and 500 °C," *Applied Physics Letters*, vol. 62, No. 13, 1993, pp. 1525-1526.

Mallik, K., et al., "Semi-Insulating" Silicon Using Deep Level Impurity Doping: Problems and Potential, *Semiconductor Science and Technology*, vol. 18, 2003, pp. 517-524.

Martin, G. M., "Key Electrical Parameters in Semi-Insulating Materials; The Methods To Determine Them as GaAs," *Semi-Insulating III-V Materials*, 1980, pp. 13-28.

Milnes, A. G., "Deep Impurities in Semiconductors," Wiley-Interscience Publication, 1973, pp. 18-23.

Raskin, Jean-Pierre, et al., "Substrate Crosstalk Reduction Using SOI Technology," *IEEE Transactions on Electron Devices*, vol. 44, No. 12, 1997, pp. 2252-2261.

Voronkova, G. I., et al., "Long-Time Relaxation of Silicon Resistivity After Annihilation of Thermal Donors," *Electrochemical Society Proceedings*, vol. 2004-05, 2004, 275-285.

Wagner, P., et al., "Thermal Double Donors in Silicon," *Applied Physics A*, vol. 49, 1989, pp. 123-138.

Wang, R. et al., "Semi-Insulating Silicon Substrates for Silicon Based RF Integrated Circuits," *1998 Topical Meeting on Silicon Monolithic Integrated Circuits in RF Systems*, 1998, pp. 164-168.

Wu, Y., et al., "$SiO_2$ Interface Layer Effects on Microwave Loss of High-Resistivity CPW Line," *IEEE Microwave and Guided Wave Letters*, vol. 9, No. 1, 1999, 10-12.

International Search Report and Written Opinion dated Oct. 27, 2006, International application No. PCT/US2006/019207, 12 pages.

* cited by examiner

HIGH RESISTIVITY SILICON STRUCTURE AND A PROCESS FOR THE PREPARATION THEREOF

CROSS-REFERENCE TO RELATED APPLICATION

This application claims the benefit of U.S. Provisional Application 60/682,691, filed May 19, 2005, which is incorporated herein by reference.

BACKGROUND OF THE INVENTION

The present invention generally relates to a high resistivity CZ silicon structure, and a process for the preparation thereof. In particular, the high resistivity silicon structure comprises a large diameter CZ silicon wafer, or a substrate derived therefrom, wherein the resistivity of the wafer or substrate is decoupled from the concentration of acceptor atoms (e.g., boron) therein, the resistivity of the structure being substantially greater than the resistivity as calculated based on the concentration of said acceptor atoms therein. Such a wafer is particularly well-suited for use in, for example, high frequency (e.g., microwave or RF) applications.

Traditionally, gallium arsenide (GaAs) wafers have been mostly used in high resistivity devices. Gallium arsenide not only has the advantage of a naturally high carrier mobility, but it also offers the possibility of high resistivity substrates which are required for device isolation and minimization of substrate cross-talk, transmission line loss and making high-Q inductors in radio frequency applications and monolithic circuits.

Recently, however, as advances in the manufacturing technology for the preparation of high resistivity single crystal silicon wafers have been achieved, the use of such wafers in the high resistivity electronics industry has expanded. Two methods are used to manufacture single crystal silicon: the Czochralski (CZ) method and the floating zone (FZ) method. Although FZ silicon is commercially available having resistivities of up to about 10 kohm-cm or more, this material has limitations. For example, such material is expensive to manufacture, it lacks the mechanical stability needed for many applications, at least in part due to the low oxygen content therein, and it is of limited size. For example, it is not available in diameters of 300 mm or more, which is the developing industry standard.

Although CZ silicon addresses many of the limitations associated with FZ silicon, CZ silicon prepared by current techniques is also not without limitations. For example, boron is a common contaminant in CZ silicon. In order to grow CZ material of sufficiently high purity to achieve such high resistivities directly, boron concentrations may typically not exceed $1.3 \times 10^{13}$ atoms/cm$^{-3}$. Manufacturing CZ silicon in commercial environments to this level of purity, or beyond, is difficult and expensive. For example, typically fully synthetic crucibles are needed. However, once such a low boron concentration is achieved, a second challenge exists, that being the presence of thermal donors. Thermal donors are produced during the thermal treatments employed as part of the integrated circuit manufacturing process, as a result of the presence of interstitial oxygen in the CZ silicon.

The formation of thermal donors is generally not problematic in low resistivity wafers because the residence time in the greater than 300 and less than 500 C temperature range within which they typically form, is relatively short, typically about one to two hours, and the majority carriers, introduced in n-type or p-type doping, will normally dominate. For high resistivity applications, where the added dopant concentration is low, however, the formation of thermal donors in the device processing steps is a major factor in final wafer resistivity. (See, e.g., W. Kaiser et al, *Phys. Rev.*, 105, 1751, (1957), W. Kaiser et al, *Phys. Rev.*, 112, 1546, (1958), Londos et al., *Appl. Phys. Lett.*, 62, 1525, 1993.) Thus, for high resistivity CZ applications, residual interstitial oxygen concentration will strongly influence the rate of thermal donor formation during device processing.

To-date, solutions proposed to the CZ thermal donor problem have essentially involved the same approach; that is, these approaches attempt to suppress the oxygen content in the silicon substrate far below that which is achievable by the CZ process alone. The idea here is that for every target value of initial substrate resistivity, there is an oxygen concentration sufficiently low, such that thermal donor generation will not be an issue. Typically, this approach involves thermal treatments to precipitate out of the solid solution the grown-in interstitial oxygen. However, this approach is costly and time consuming, involving long periods of time, typically tens of hours, at high temperatures.

SUMMARY OF THE INVENTION

Briefly, therefore, the present invention is directed to a high resistivity CZ single crystal silicon wafer. The wafer has a nominal diameter of at least 150 mm and comprising a concentration of thermal donors [TD] and acceptors [A], wherein the ratio [TD]:[A] is between about 0.8:1 and about 1.2:1.

The present invention is further directed to a high resistivity silicon structure comprising a CZ single crystal silicon substrate, the substrate having a concentration of thermal donors [TD] and acceptors [A] wherein the ratio [TD]:[A] is between about 0.8:1 and about 1.2:1.

The present invention is still further directed to a high resistivity silicon structure having a CZ single crystal silicon substrate containing boron and having a resistivity that is substantially greater than the resistivity as calculated based on said boron concentration. In one preferred embodiment, the resistivity is at least about 5 or about 10 times greater than the resistivity as calculated based on the boron concentration.

The present invention is still further directed to a high resistivity CZ single crystal silicon wafer, said wafer having a nominal diameter of at least about 150 mm, containing boron, and having a resistivity that is substantially greater than the resistivity as calculated based on said boron concentration. In one preferred embodiment, the resistivity is at least about 5 or about 10 times greater than the resistivity as calculated based on the boron concentration.

The present invention is still further directed to a process for the preparation of one or more of the above-referenced high resistivity silicon wafers or structures. For example, the present invention is still further directed to a process for preparing a high resistivity silicon structure, the process comprising subjecting a silicon structure, which comprises a CZ single crystal silicon substrate having an initial resistivity of at least about 50 ohm-cm, to a heat-treatment for a duration and at a temperature such that the resulting substrate of the heat-treated structure has a concentration of thermal donors [TD] and acceptors [A] wherein the ratio [TD]:[A] is between about 0.8:1 and about 1.2:1.

The present invention is still further directed to a process for preparing a high resistivity CZ single crystal silicon wafer, the process comprising subjecting a CZ single crystal silicon wafer having a nominal diameter of at least 150 mm and an initial resistivity of at least about 50 ohm-cm to a heat-treatment for a duration and at a temperature such that the resulting heat-treated wafer has a concentration of thermal donors [TD] and acceptors [A] wherein the ratio [TD]:[A] is between about 0.8:1 and about 1.2:1.

The present invention is still further directed to a process for preparing a high resistivity silicon structure. The process comprises subjecting a silicon structure, which comprises a CZ single crystal silicon substrate containing boron and interstitial oxygen and having an initial resistivity of at least about 50 ohm-cm, to a heat-treatment for a time and at a temperature sufficient to obtain a single crystal silicon structure having a CZ single crystal silicon substrate with a resulting resistivity that is substantially greater than the resistivity as calculated based on the boron concentration therein. In one preferred embodiment, the resistivity is at least about 5 or about 10 times greater than the resistivity as calculated based on the boron concentration.

The present invention is further directed to a process for preparing a high resistivity CZ single crystal silicon wafer. The process comprises subjecting a CZ single crystal silicon wafer containing boron and interstitial oxygen and having an initial resistivity of at least about 50 ohm-cm to a heat-treatment for a time and at a temperature sufficient to obtain a CZ single crystal silicon wafer with a resulting resistivity that is substantially greater than the resistivity as calculated based on the boron concentration therein. In one preferred embodiment, the resistivity is at least about 5 or about 10 times greater than the resistivity as calculated based on the boron concentration.

The present invention is still further directed to one of the preceding processes wherein the boron concentration [B] and the oxygen concentration [Oi] of the substrate of the structure, or wafer, and the temperature, T, of the heat-treatment, are related by the following equation:

$$[B] = 1e14 ([O_i]/[O_i]_{ref})^n \exp(E/kT - E/kT_{ref})$$

wherein: [B] is the boron concentration; $[O_i]_{ref}$ is the reference interstitial oxygen concentration and is about 6.6e17 $cm^{-3}$; $[O_i]$ is the actual interstitial oxygen concentration of the wafer or substrate of the structure; n is the oxygen exponent and is about 7; E is the activation energy and is about 4 eV; k is the Boltzmann constant; T is the actual temperature of the heat-treatment; and, $T_{ref}$ is the reference temperature and is about 520° C., and further wherein: (i) for a given boron concentration, [B], the oxygen concentration may be about +/−0.5 ppma of the calculated concentration and the temperature of the heat-treatment may be about +/−10° C. of the calculated temperature; (ii) for a given oxygen concentration, [Oi], the boron concentration may be about +/−20% of the calculated concentration and the temperature of the heat-treatment may be about +/−10° C. of the calculated temperature; and, (iii) for a given temperature of the heat-treatment, T, the oxygen concentration may be about +/−0.5 ppma of the calculated concentration and the boron concentration may be about +/−20% of the calculated concentration.

The present invention is still further directed to an assembly of the preceding silicon structures and/or wafers, said assembly comprising for example at least about 10, 20 or more of the structures or wafers.

The present invention is still further directed to one of the preceding silicon wafers, wherein said wafer has an epitaxial silicon layer deposited on a surface thereof. Alternatively, the present invention is directed to a silicon-on-insulator structure comprising one of the preceding silicon wafers, wherein said wafer serves as the substrate, or handle wafer, of said silicon-on-insulator structure.

BRIEF DESCRIPTION OF THE DRAWINGS

(FIG. 7a) and at about 570° C. (FIG. 7b).

In FIG. 9a, the numbers 1-4 on the curves refer to oxygen concentrations of (5, 6, 7 and 8)×$10^{17}$ $cm^{-3}$, respectively (these concentrations correspond to 10, 12, 14 and 16 ppma, respectively).

FIG. 16a illustrates resistivity for boron concentration of about $2e^{13}$ cm$^{-3}$ (curve 1) and about $2e^{14}$ cm$^{-3}$ (curve 2). FIG. 16b illustrates the resistivity enhancement factor, which is universal for essentially any initial resistivity.

FIG. 18b illustrates the results of a treatment at 530° C., applied after an 1100° C. outdiffusion anneal and then a pre-anneal at 450° C. (i.e., a normal thermal donor create anneal at 450° C. was performed prior to the anneal at 530° C. and after the anneal at 1100° C.). FIG. 18c illustrates the results of a treatment at 530° C., applied with no outdiffusion anneal and no pre-anneal to form thermal donors. FIG. 18d illustrates the results of a treatment at 530° C., performed after a pre-anneal at 450° C. to form thermal donors. In all figures here, depth dependent (0 to 120 microns) of resistivity (SRP) is shown.

DETAILED DESCRIPTION OF THE PREFERRED EMBODIMENTS

In accordance with the present invention, and as set forth in greater detail herein below, it has been discovered that a CZ single crystal silicon wafer, or a silicon structure comprising a substrate derived from such a wafer, may be prepared in accordance with the process of the present invention to have a resistivity which essentially becomes decoupled from the concentration of acceptor atoms (e.g., boron atoms) therein. The present process employs a controlled thermal treatment of the silicon wafer, or silicon structure comprising a substrate derived from such a wafer, in order to form thermal donors therein, which act to "cancel out" the effect acceptors atoms present therein have on the resistivity thereof. As a result, a CZ single crystal silicon wafer, or a silicon structure comprising a substrate derived from such a wafer, may be prepared to have a very high resistivity (e.g., a resistivity, for example, in the range of thousands to tens of thousands of ohm-cm).

1. Compensation or "Cancelling Out"

With respect to resistivity, the general concept of "compensation" between acceptor atoms (e.g., boron atoms) and donor atoms (e.g., oxygen clusters, known as thermal donors because they are formed upon heating to elevated temperature), is known and relates to the idea of cancelling out the effect acceptor atoms, such as boron atoms, have on the resistivity of silicon by adding, or introducing, donor atoms, such as oxygen thermal donors, to the silicon. Although this concept is known, to-date it has not been applied in a way which achieves compensation over a substantial portion of a large diameter CZ silicon wafer (e.g., a nominal diameter of greater than 150 mm, 200 mm, 300 mm or more), or a substrate derived therefrom. In general, and without being held to a particular theory, it is believed that failed attempts to achieve such a result to-date are due to the belief that compensation may be achieved only when four variables are matched: (i) thermal donor atom concentration, (ii) acceptor atom concentration, (iii) duration of the thermal treatment employed to form the thermal donors, and (iv) temperature of that thermal treatment.

a. Thermal Donor Effect on Resistivity: Thermal Treatments Below 450° C.

Figure 1:
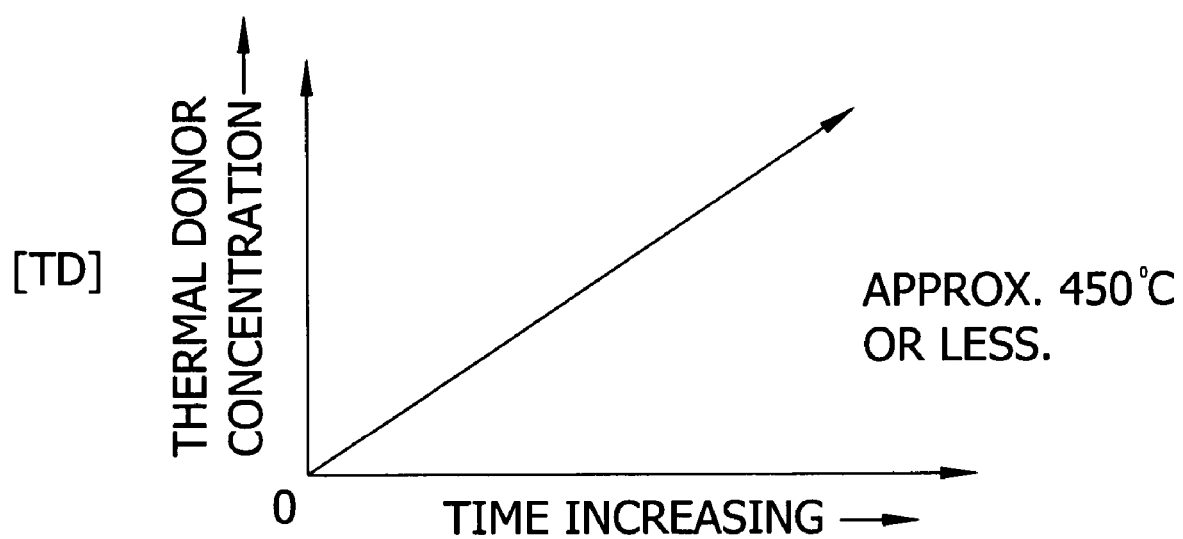
FIG. 1 is a graphical illustration of the generally accepted view of how thermal donor concentration changes in CZ single crystal silicon over time, when annealed at a temperature of about 450° C. or less. It is to be noted that the slope of the line illustrated herein is generally understood to be dependent upon the oxygen concentration, to the fourth power, in the silicon being annealed.

Referring now to FIG. 1, currently, the generally accepted view is that thermal donor concentration, [TD], increases as the duration of heating increases, the rate of increase (i.e., the slope of the line in FIG. 1) being dependent, to the fourth power, on the oxygen concentration in the CZ silicon being heated. However, this view is essentially based on thermal treatments performed at a temperature of about 450° C. or less.

Figure 2:
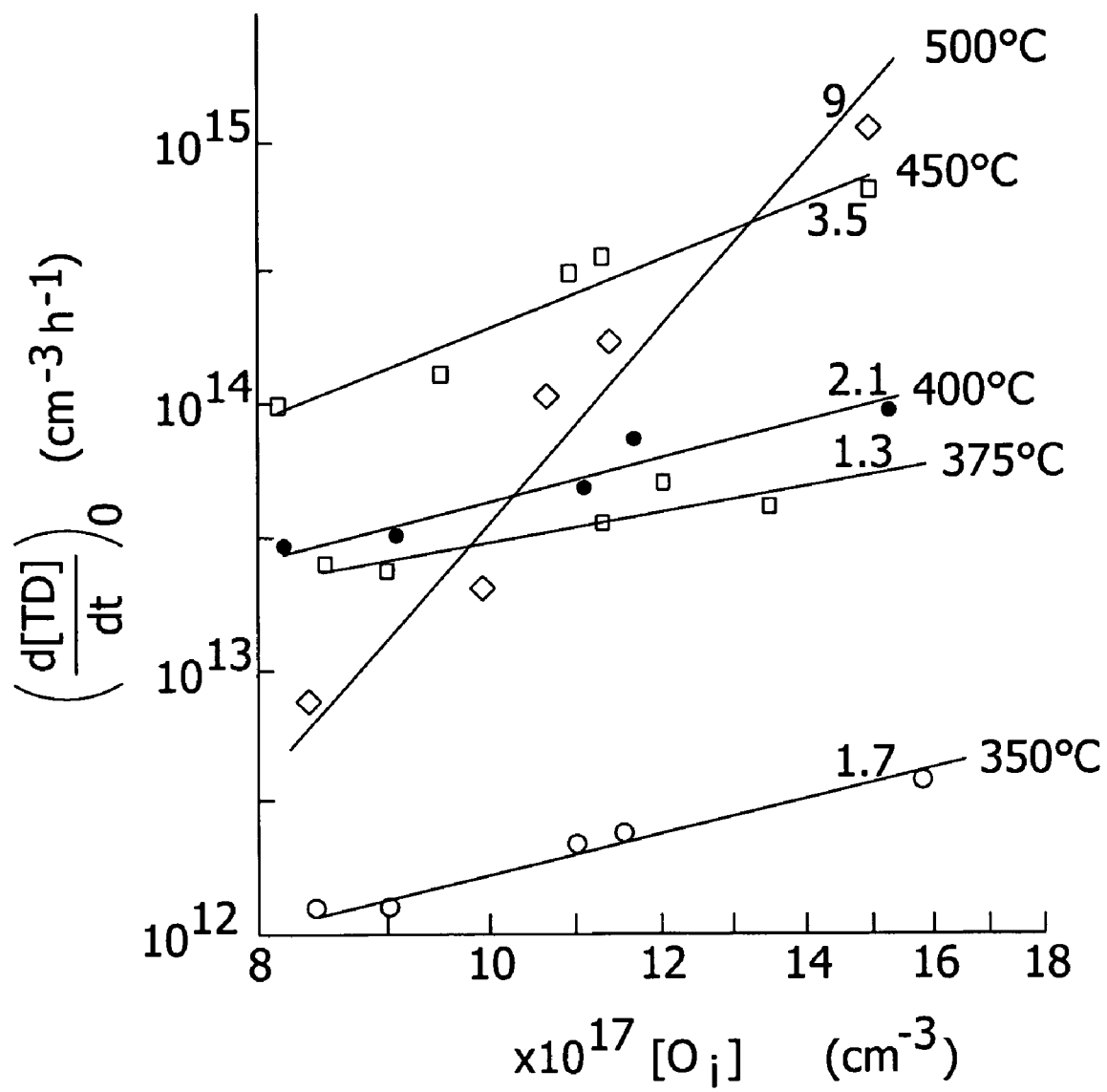
FIG. 2 is a graphical illustration of the initial formation rates of thermal donors.

The added electrons due to the generation of thermal donors may measurably affect the resistivity, and type, of a piece of silicon. However, this is generally only true if the concentration of the resulting additional electrons (2× the concentration of the TDs themselves) approaches the concentration (e.g., within about a few percent, such as less than about 5%, 4%, 3%, 2% or less) of the dopant concentration, or exceeds it. The rate at which TDs are created depends primarily on two things: 1) the temperature of the anneal; and, 2) the oxygen concentration. Referring now to FIG. 2, the result of a relatively recent study of the rate of TD formation as a function of these two variables is illustrated. (See, e.g., Landos et al., *Appl. Phys. Lett.*, 62, 1525 (1993).)

Figure 3:
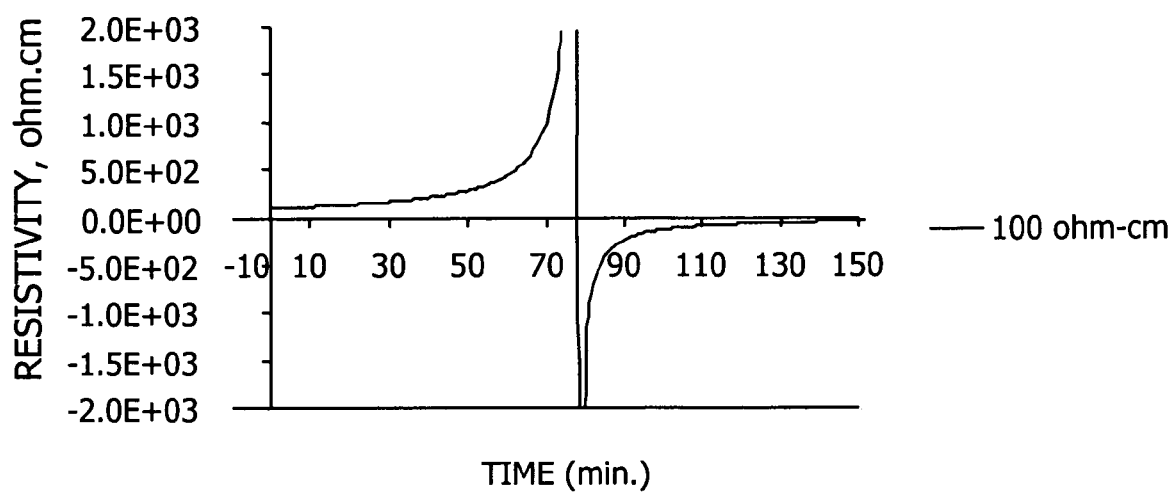
FIG. 3 is a graphical illustration of the typical behavior of resistivity during the generation of thermal donors (TDs) during annealing. This is a calculated example using a typical TD generation rate of about 1e14 $cm^{-3}$/hour and an initial 100 ohm-cm p-type (approximate) sample. In this graph, negative resistivity values indicate n-type conductivity.

In p-type silicon, when the total concentration of TD generated electrons begins to get close to the concentration of the dopant (usually boron), resistivity rapidly increases, as the boron generated holes are being "compensated" by the TD generated electrons, steadily toward an extremely high value (e.g., perhaps as high as about 300 kohm-cm), at the point where the TD electron concentration about equals the boron concentration. As the TD electron concentration increases further beyond that of the boron concentration, the majority carrier becomes electrons and the type of the material is converted from p-type to n-type. As yet more TD electrons are created, the resistivity begins to rapidly decrease while remaining n-type. An example of typical resistivity behavior during TD generation is shown in FIG. 3. This is a calculated case assuming a typical TD generation rate of $1e14$ $cm^{-3}$/hr and an initially 100 ohm-cm p-type sample.

A very high resistivity state is achieved for only a very short period of time (typically on the order of minutes, for example less than about 30 minutes, 20 minutes, 10 minutes or even 5 minutes) at some point during the anneal. The position in time during annealing of this extremely high resistivity state and the changeover from p-type to n-type depends on the rate of TD generation, and hence on the concentration of oxygen and the temperature of the anneal, and on the concentration of boron in the sample being annealed.

Figure 4:
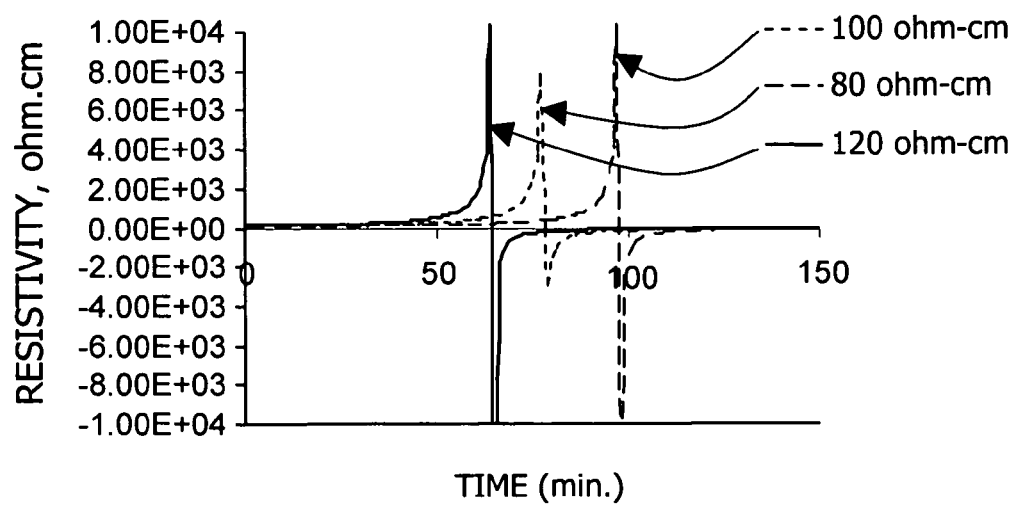
FIG. 4 is a graphical illustration of the effect of starting resistivity only on TD influenced resistivity during anneals. This is a calculated example using a typical TD generation rate of about 1e14 $cm^{-3}$/hour and initial resistivities of about 80, 100 and 120 ohm-cm (p-type). In this graph, negative resistivity values indicate n-type conductivity.

Since the peak of the resistivity versus time graphs depend on a matching of the generated TDs to the boron concentration, the shape of the curves depend on the initial resistivity of the sample, even if everything else (e.g., anneal temperature and oxygen concentration) is essentially the same. FIG. 4 illustrates this point, wherein the development of resistivities of three samples is calculated. From this, it can be seen that the resulting resistivities of the materials (having starting resistivities of about 80, 100 and 120 ohm-cm) are close, but not equal.

Figure 5:
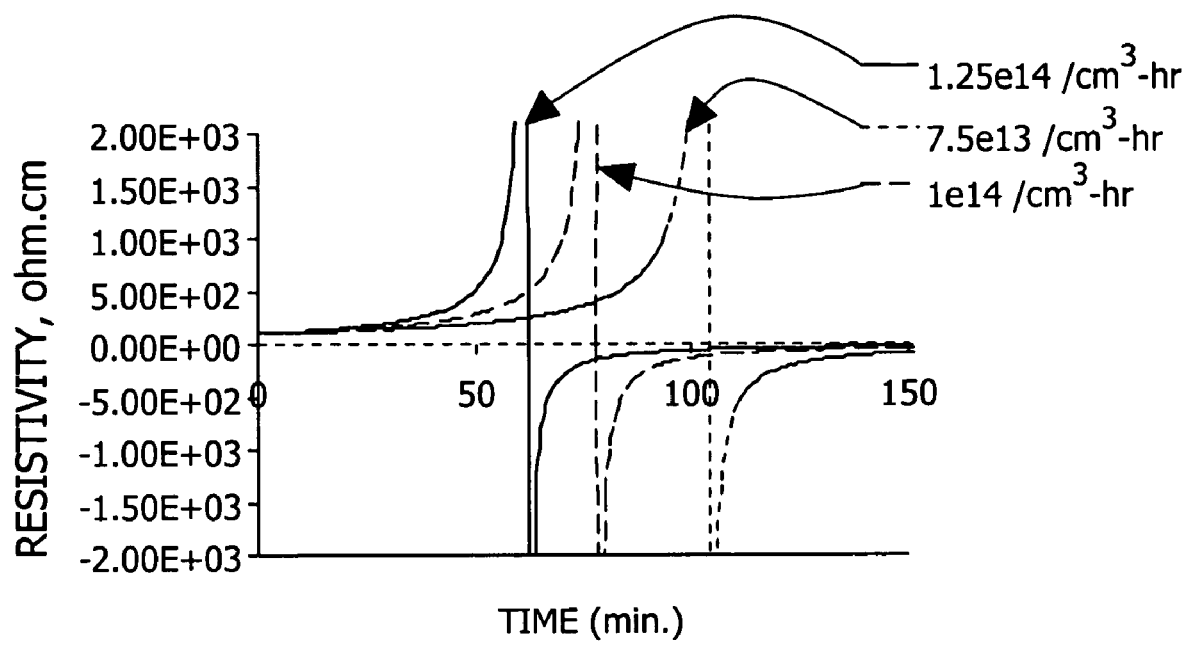
FIG. 5 is a graphical illustration of the effect of oxygen concentration range on TD influenced resistivity during anneals. These are calculated examples using a typical TD generation rate of about 1e14 $cm^{-3}$/hour for the middle of a hypothetical oxygen concentration range. For a typical oxygen concentration dependence of about $[O_i]^4$, the rate range spanned in this graphical illustration would correspond to an oxygen concentration range of about +/−0.5 ppma. The initial resistivity of all examples herein is 100 ohm-cm p-type. In this figure, negative resistivity values indicate n-type conductivity.

The oxygen concentration dependence of TD formation rates is large. At a TD formation temperature of about 500° C., it is found to be $[Oi]^9$, while at about 450° C. it is $[Oi]^4$, and at about 400° C. it is about $[Oi]^2$. To see the effect of such a dependence, we may consider the following example. A typical oxygen concentration specification is +/−1 ppma. Using the example of the least strong dependence on $[Oi]:[Oi]^2$, we may compare the effect of a change in generation rate of +/−0.25e14 around our typical example rate of $1e14$ $cm^{-3}$/hour. This is illustrated in FIG. 5. More realistically, for the more typical TD generation temperature 450° C. (and corresponding to a rate dependence of $[Oi]^4$), the same variation in the rate dependence would correspond to a significantly tighter oxygen concentration range (i.e., +/−0.5 ppma around a target value).

b. Thermal Donor Effect on Resistivity: Thermal Treatments Above 450° C.

Figure 6:
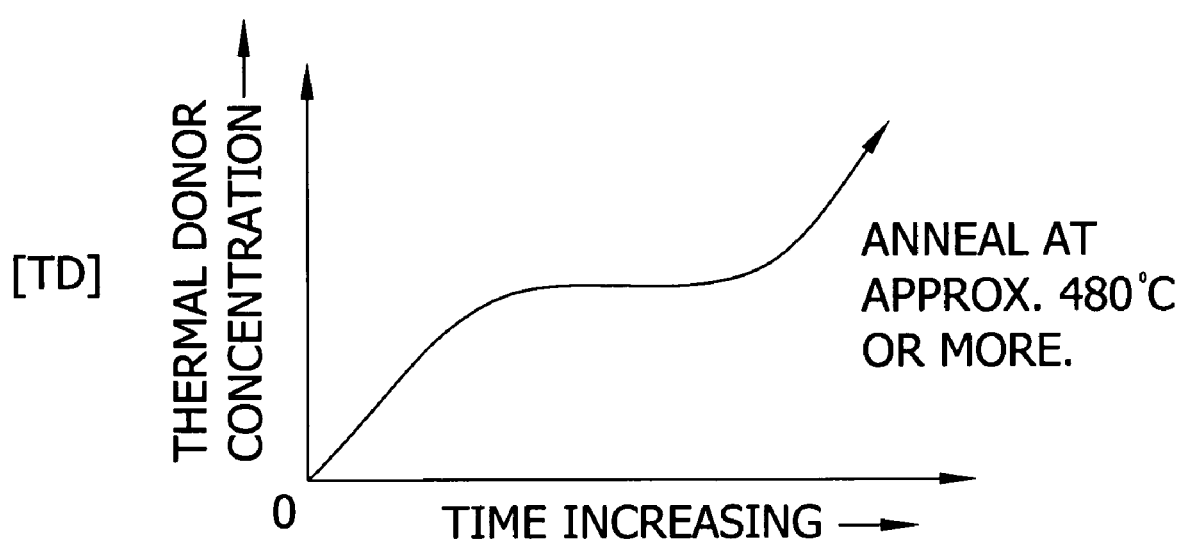
FIG. 6 is a graphical illustration of how, in accordance with the discovery of present invention, thermal donor concentration changes in CZ single crystal silicon over time, when annealed at temperatures in excess of those conventionally applied (e.g., about 480° C. or more). It is to be noted that, in accordance with the present invention, it has been discovered that, at elevated temperatures, the concentration of thermal donors reaches a plateau for a period of time.

In contrast, and referring now to FIG. 6, it has been discovered, in accordance with the present invention, that if the CZ silicon is heated to higher temperatures (e.g., greater than about 480° C., about 490° C., about 500° C. or more, such as between about 480° C. and about 600° C., or between about 485° C. or about 490° C. and about 590° C., or between about 500° C. and about 575° C., as detailed elsewhere herein), the concentration of thermal donors increases, but not monotonically, as in the case with conventional thermal donors (e.g., up to some maximum of about $1e16$ $cm^{-3}$). Rather, at some point this concentration saturates, or reaches a plateau, for a period of time (e.g., at least about 30 minutes, about 60 minutes, about 90 minutes, about 120 minutes or more). Stated another way, the thermal donor concentration may increase initially, but at some point during this heat treatment the rate at which the thermal donor concentration is increasing is substantially reduced, and may become substantially constant (see, e.g., FIGS. 7a, 7b and 8), for a period of time. If the heat treatment continues for a sufficiently long period of time, the thermal donor concentration may once again begin to increase.

Figure 7A:
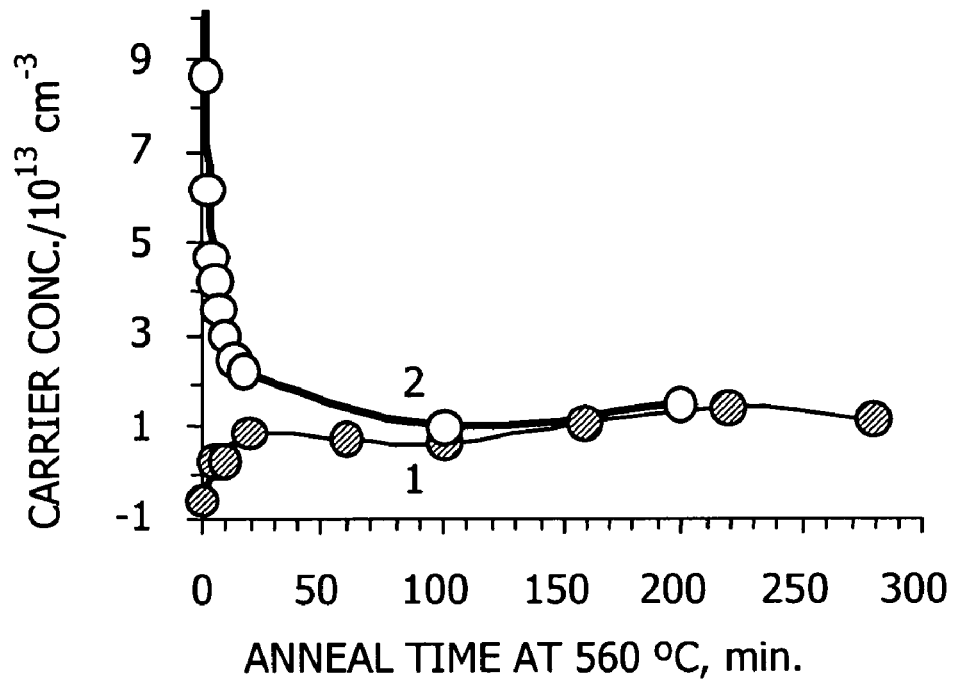
FIGS. 7a and 7b are graphical illustrations of kinetic curves for TD generation (curve 1) and for decay of pre-generated TDs (curve 2), for annealing at about 560° C.
Figure 7B:
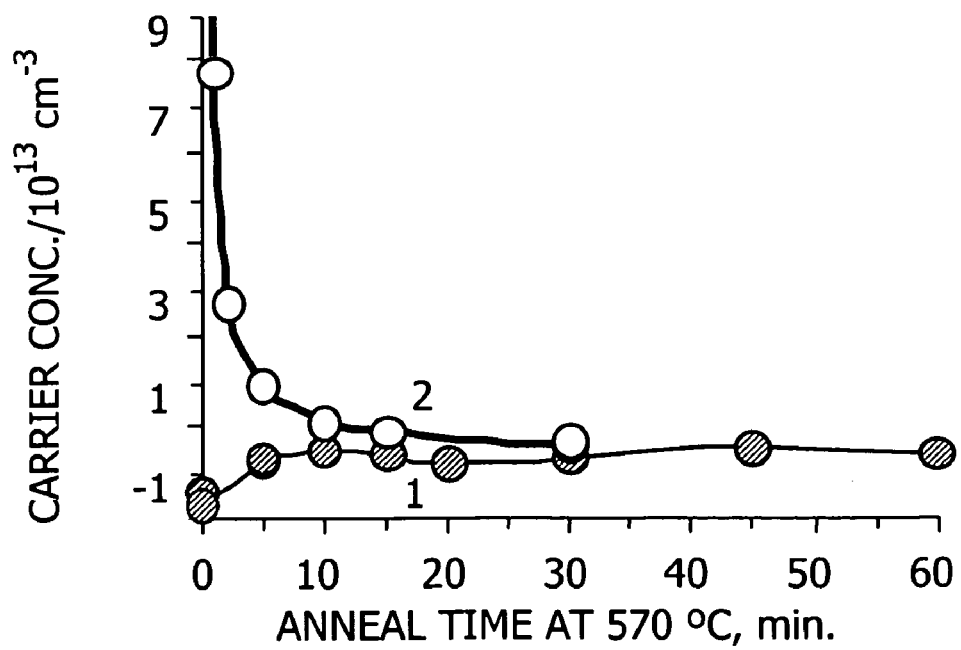

The value of the added electron concentration of the plateau region was found to be dependent on the anneal temperature and the oxygen concentration of the samples. The same plateau region in added electron concentration is reached regardless of whether the sample had pre-generated thermal donors (from a prior TD anneal at, say 450° C.) or not. Two examples of plateau regions found in samples of oxygen concentration of 6e17 cm-3 (initially about 300 ohm-cm p-type boron doped) are shown in FIGS. 7a and 7b for annealing temperatures of 560° C. and 570° C., respectively.

As illustrated by the equation below, the concentration of added electrons, N, in the plateau region was found to exhibit an Arrhenius relationship with temperature, wherein E equals about 4.2 eV. The oxygen concentration dependence is estimated to be in a power law relation, with n equal to about 7.

$$N\sim[Oi]^7 \exp[4.2\ eV/kT]$$

Figure 8:
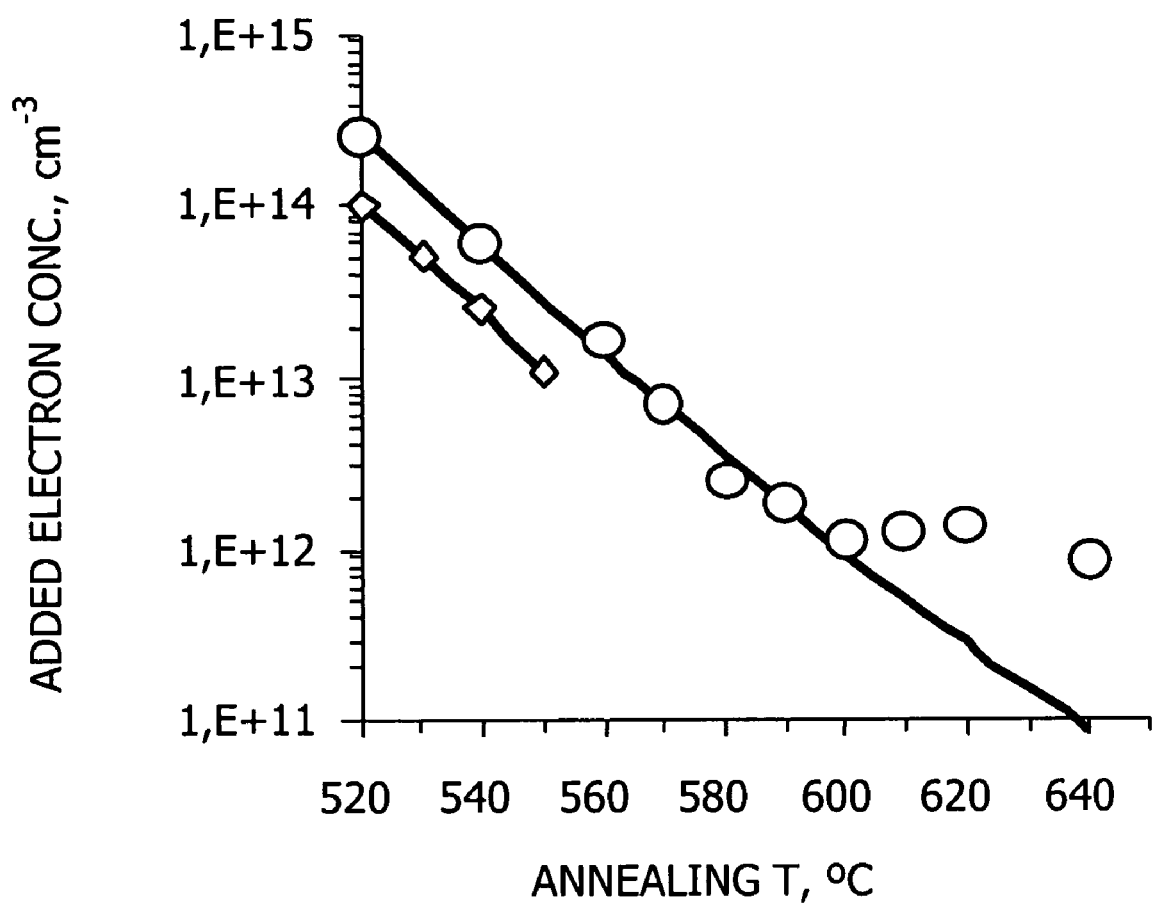
FIG. 8 is a graphical illustration of the measured, saturated, added electron concentration in low boron concentration material (about 2e12 $cm^{-3}$) for two different oxygen concentrations, as a function of temperature. The lower curve (squares) is for a lower oxygen concentration.

FIG. 8 shows annealing temperature and oxygen concentration data for the plateau, or saturated, added electron concentrations experimentally determined to-dated.

Having a relatively wide plateau of saturated electron concentration in time is useful for a viable process of increasing the resistivity of a population of silicon wafers. It would be some improvement over the conventional thermal donor approach to match the added electron concentration of the plateau region with the background boron concentration. The system would not be as sensitive to the annealing time. However, this is typically not enough for a satisfactory commercial solution, because it reduces the restrictions on only one of the four variables, that being time. The restrictions on the other three variables (i.e., [Oi], [B], and anneal temperature), remain.

Conventional knowledge in the art suggests that, even if the above-noted window of time exists, wherein thermal donor concentration saturates or plateaus, thermal donor concentration must still be in precise relationship with the acceptor concentration (e.g., one-half of the thermal donor concentration is equal to the boron concentration), in order to achieve a high resistivity state in the CZ silicon. However, in accordance with the present invention, it has been further discovered that this is not the case; that is, there does not have to be a precise match between the value of the acceptor atom concentration (e.g., boron atom concentration) and the saturated or plateau electron concentration (which is a function of the thermal donor concentration), by means of for example controlling the anneal temperature and time. Rather, simply getting these two close to one another is sufficient. Without being held to a particular theory, it is generally believed that this is the case because the high resistivity state is the natural state of this system, and thus the system simply adjusts itself to the high resistivity state when these two are close enough to each other. As a result, there is a commercially practical window of operation here.

Additionally, and also without being held to any particular theory, it is further believed that a key point here is the controlled creation, in the higher reaches of the thermal donor temperature range (e.g., T greater than about 480° C.) of a second type of thermal donor, distinct from the "normal" thermal donor. This new type of thermal donor may be characterized as a "reconstructing" species and one that allows for the system to "self-compensate" to adjust itself to a high resistivity state. In contrast, the "normal" type is a "stable" type. Accordingly, what is preferably to be done to create a high resistivity state by this approach is as follows—one approximately matches the plateau concentration for a given oxygen concentration and temperature to the boron concentration one wishes to compensate. To this end, the data of FIG. 8, and from it an analytical expression for this (i.e., Equation (1a) set forth below), may be used to roughly estimate the allowable combinations of oxygen concentration and anneal temperature to produce a saturated excess electron concentration somewhere close (as further detailed herein below) to the boron concentration. Alternatively, by fixing any one of the three variables, [Oi], [B], or T, and the possible combinations of the other two may be worked out. Fixing two of the three variables thus fixes the third.

2. High Resistivity Silicon and Process for the Preparation Thereof a. Thermal Treatment In view of the foregoing, it is to be noted that, in accordance with the present invention, a CZ single crystal silicon wafer, or a silicon structure comprising a substrate derived from such a wafer, comprising acceptor atoms, in particular boron, and interstitial oxygen, may be subjected to a thermal treatment for a time and at a temperature sufficient to yield a wafer, or silicon structure comprising a substrate derived from such a wafer, which has a resistivity that is substantially greater than the resistivity as calculated based on the concentration of acceptor atoms (e.g., boron) therein. As such, the resulting wafer, or substrate of the silicon structure, has a resistivity that is essentially "decoupled" from the concentration of acceptor atoms (e.g., boron) therein.

It is to be noted that, as used herein, the resistivity of the resulting heat treated CZ single crystal silicon wafer, or the resulting heat treated CZ single crystal silicon substrate of the resulting silicon structure, is "substantially greater than" the resistivity as calculated based on the concentration of acceptor atoms (e.g., boron) therein, when the resistivity is at least about 5 times greater than the calculated resistivity, and preferably is at least about 10 times, still more preferably about 15 times, still more preferably about 20 times, still more preferably about 25 times, still more preferably about 30 times, still more preferably about 35 times, still more preferably about 40 times, still more preferably about 45 times, still more preferably about 50 times, still more preferably about 55 times, still more preferably about 60 times, still more preferably about 65 times, still more preferably about 70 times, still more preferably about 75 times, still more preferably about 80 times, still more preferably about 85 times, still more preferably about 90 times, still more preferably about 95 times, and still more preferably about 100 times greater than the calculated resistivity.

In accordance with the present invention, and as further detailed herein below, it has been discovered that such a wafer, or silicon structure, may be obtained when the relationship between acceptor concentration (e.g., boron concentration [B]), interstitial oxygen concentration [Oi], and temperature, T, of the heat-treatment is sufficiently controlled, such that the detrimental effects of acceptors and thermal donors on resistivity are significantly reduced. In particular, it has been discovered that, for example, the boron concentration, [B], interstitial oxygen concentration, [Oi], and temperature, T, of the heat-treatment may be related by the following Equation (1a):

$$[B] = 1e14 ([O_i]/[O_i]_{ref})^n \exp(E/kT - E/kT_{ref}) \quad (1a)$$

wherein:

[B] is the boron concentration;

$[Oi]_{ref}$ is the reference interstitial oxygen concentration and is about $6.6e17\ cm^{-3}$;

[Oi] is the actual interstitial oxygen concentration of the wafer or substrate;

n is the oxygen exponent and is about 7;

E is the activation energy and is about 4 eV;

k is the Boltzmann constant;

T is the actual temperature of the heat-treatment; and;

$T_{ref}$ is the reference temperature and is about 520° C.;

and further wherein, in view of flexibility afforded by the present invention, and in accordance with the relationships set forth above in Equation (1a):

(i) for a given boron concentration, [B], the oxygen concentration may be about +/−0.5 ppma, preferably about +/−0.4 ppma, more preferably about +/−0.3 ppma, and still more preferably about +/−0.25 ppma of the calculated concentration and the temperature of the heat-treatment may be about +/−10° C., preferably about +/−9° C., more preferably about +/−8° C., still more preferably about +/−6° C., and still more preferably about +/−5° C. of the calculated temperature;

(ii) for a given oxygen concentration, [Oi], the boron concentration may be about +/−20%, preferably about +/−18%, more preferably about +/−16%, still more preferably about +/−14%, still more preferably about +/−12%, and still more preferably +/−10% of the calculated concentration and the temperature of the heat-treatment may be about +/−10° C., preferably about +/−9° C., more preferably about +/−8° C., still more preferably about +/−6° C., and still more preferably about +/−5° C. of the calculated temperature; and/or, (iii) for a given temperature of the heat-treatment, T, the oxygen concentration may be about +/−0.5 ppma, preferably about +/−0.4 ppma, more preferably about +/−0.3 ppma, and still more preferably about +/−0.25 ppma of the calculated concentration and the boron concentration may be about +/−20%, preferably about +/−18%, more preferably about +/−16%, still more preferably about +/−14%, still more preferably about +/−12%, and still more preferably +/−10% of the calculated concentration.

In this regard it is to be understood that any number recited above for boron concentration, as it relates to oxygen concentration and/or the heat-treatment temperature, may be used in combination with any number recited above for oxygen concentration, and vice versa. Additionally, it is to be understood that any two numbers recited above for boron concentration (or oxygen concentration) may be used in combination to define a range of acceptable concentrations for boron (or oxygen), in accordance with the present invention.

Figure 9A:
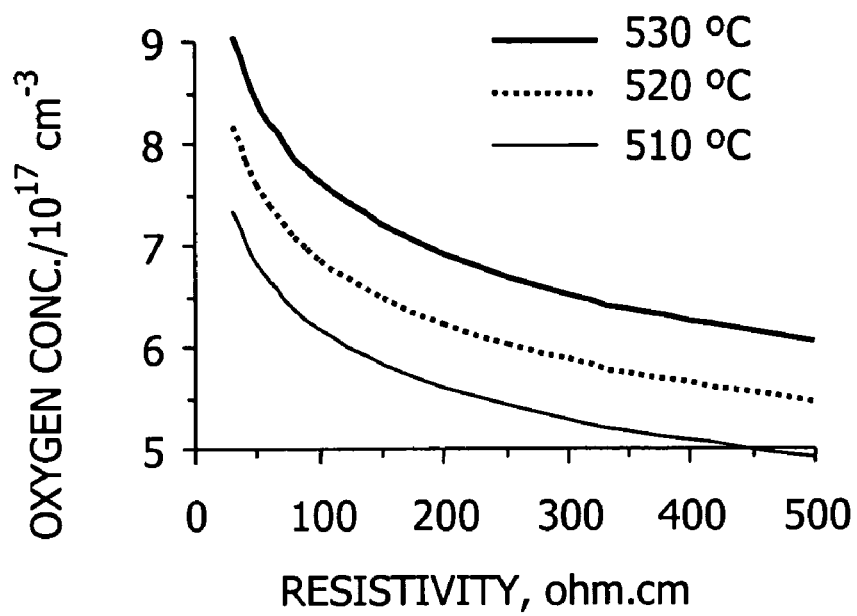
FIGS. 9a and 9b are graphical illustrations of the loci of points in temperature, initial resistivity and oxygen concentration space in which the conditions for achieving the high resistivity state by the present invention are met (as defined by Equation (1a)).
Figure 9B:
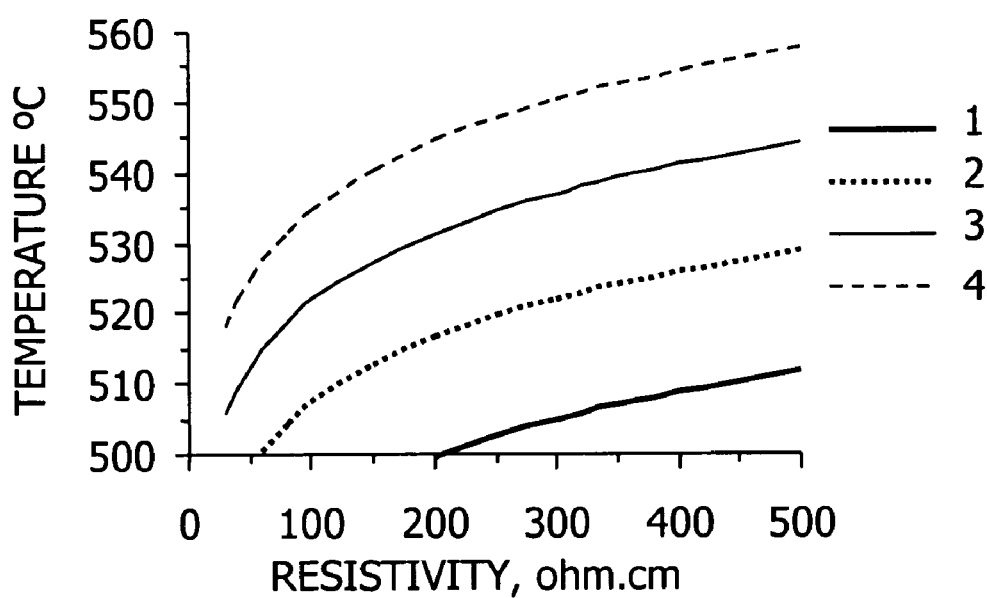
Figure 10A:
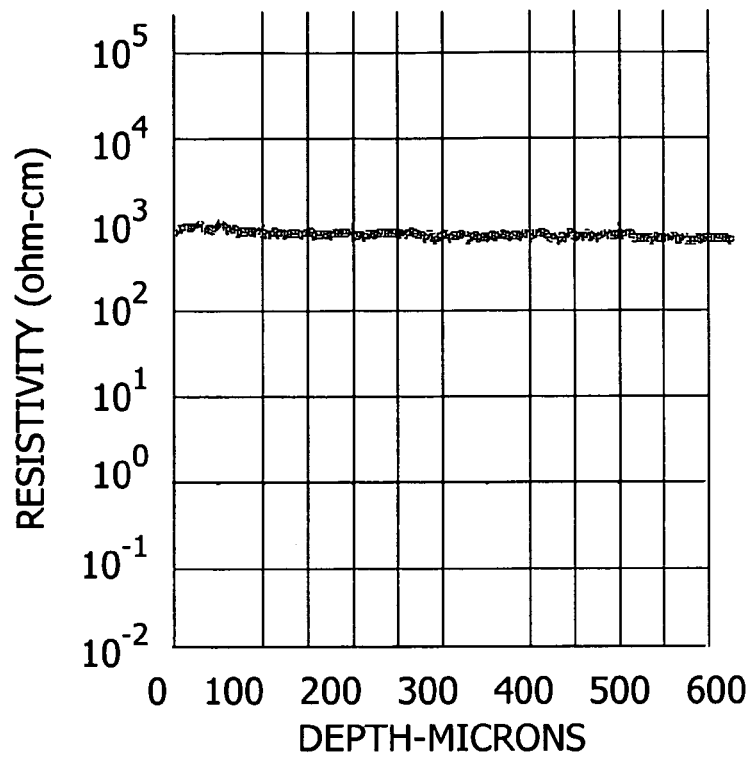
FIGS. 10a to 10d are 4 plots which illustrate "spreading resistance" measurement data taken on one wafer subjected to the process of the present invention, in order to raise the resistivity, wherein uniformity of the effect achieved by the present process is illustrated therein. The resistivity, as a function of depth in the wafer, was measured at four different points along the radius. The radial positions are given as 1, 3, 5 and 7 cm from the edge of a 200 mm wafer, respectively (i.e., FIG. 10a is 1 cm from the edge, FIG. 10b is 3 cm from the edge, FIG. 10c is 5 cm from the edge, and FIG. 10d is 7 cm from the edge). Each curve is the resistivity from the front surface "0" toward the back. The scales run from 0 to 600 microns. The total thickness of the wafers was about 675 microns. The measured data closely follows the value $10^3$ at essentially all radial positions at essentially all depths. This data shows that the present process is capable of delivering substantially uniform results in both radius and depth. (In these graphs, the Y axis is resistivity, the range thereon being from $10^{-2}$ ohm-cm up to $10^5$ ohm-cm; that is, from bottom to top, the horizontal lines denote a resistivity of $10^{-2}$, $10^{-1}$, $10^0$, $10^1$, $10^2$, $10^3$, $10^4$, and $10^5$ ohm-cm, respectively. The X axis is the depth, the range thereon being 0 to 600 microns; that is, each vertical line on the X axis denotes an increment of 50 microns, from 0 to 600 microns.)
Figure 10B:
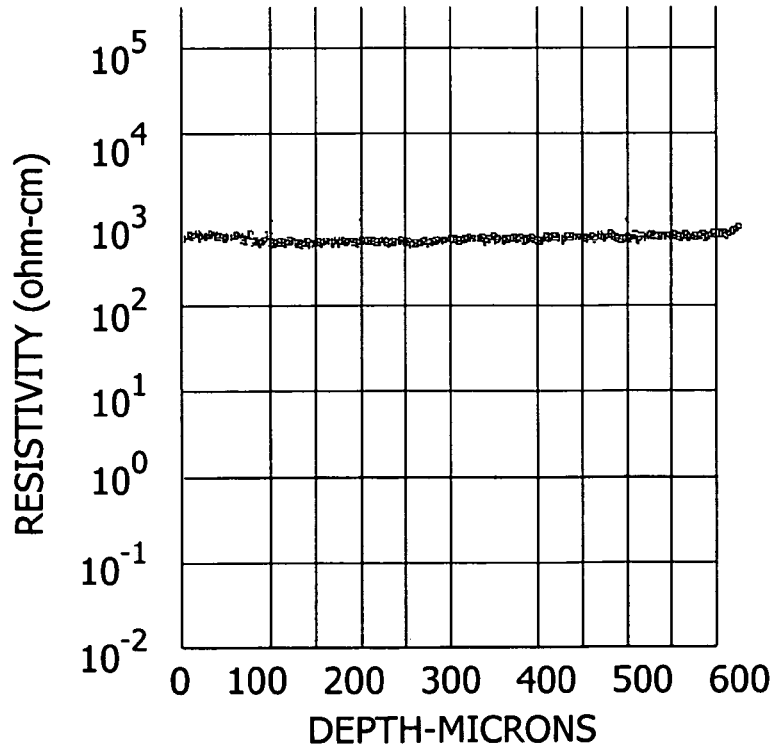
Figure 10C:
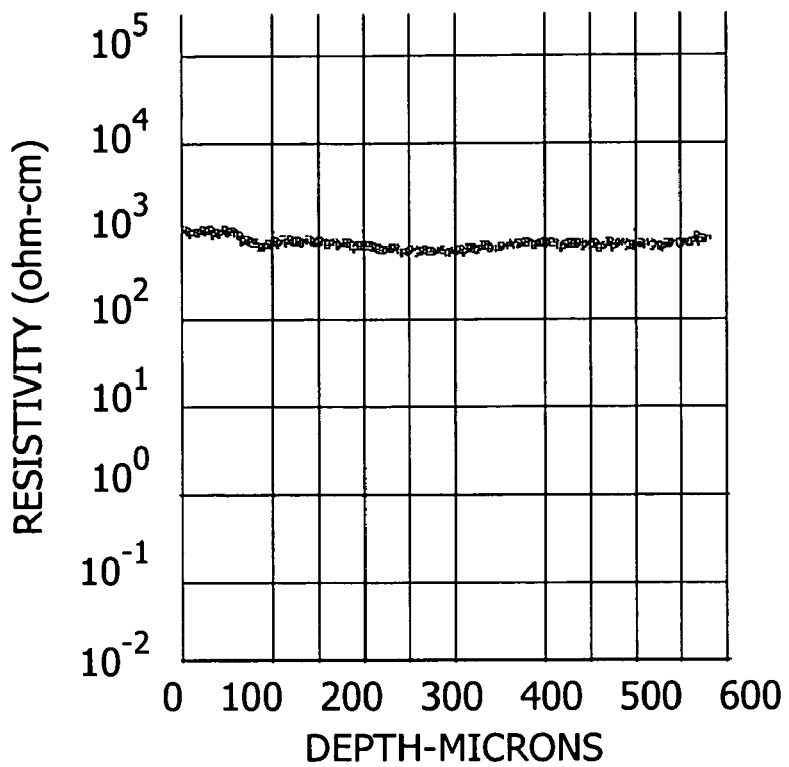
Figure 10D:
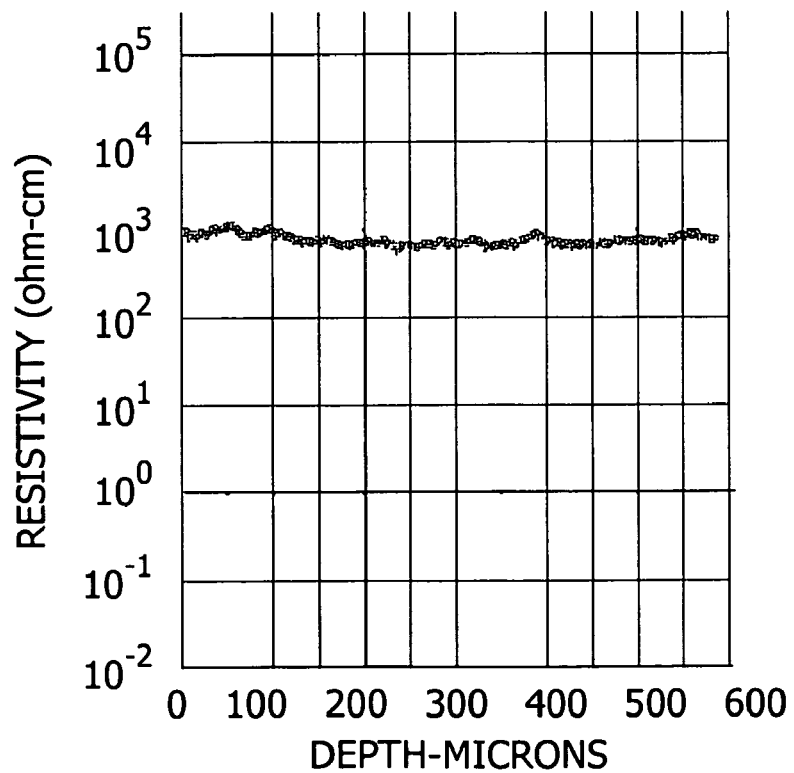

Referring now to FIG. 9, some representative plots of calculations performed using Equation (1a) are provided for purposes of illustration. Additionally, Examples provided herein below (e.g., Examples 1-3) further illustrate results that may be obtained using the above-noted equation, and the methods detailed herein.

With respect to Equation (1a), it is to be noted that, in practice, the combination of the parameters may be freely chosen, or one or two of the parameters may be fixed by some other consideration (e.g., the anneal temperature, for example, may be limited by requirements of the integrated circuit manufacturing process). Additionally, fixing two of the parameters acts to restrict the choice of the third.

Also with respect to Equation (1a), it is to be noted that after choosing a set of suitable process parameters, a sample may be annealed at the required temperature for a period of time. This required time is generally on the order of, for example, about 30 to about 120 minutes, but may be longer (e.g., about 150 to about 250 minutes) or shorter (e.g., about 10 to about 25 minutes). The actual time required for annealing the sample may vary and may require some general experimentation to determine. Following the annealing, the sample is in a highly resistive state.

It is to be still further noted that Equation (1a) may optionally be expressed more generally in terms of acceptor concentration, rather than boron concentration. However, experience to-date indicates that boron is the most common acceptor, and thus typically of most concerned, in CZ single crystal silicon. As such, reference will typically be made to boron concentration throughout the present document. However, it is to be understood that such references may optionally be more generally interpreted to reference acceptor concentration.

It is to be still further noted that, based on experience to-date and as set forth in greater detail elsewhere herein, the temperature for which the above-noted relationship is optimal is typically within the range of at least about 480° C. to less than about 600° C., or at least about 485° C. or about 490° C. to less than about 580° C., or at least about 500° C. and about 575° C. Durations for the heat-treatment may also vary, as detailed elsewhere herein, but typically are within the range of at least about 10 minutes to less than about 250 minutes, or about 15 to about 200 minutes, or about 20 to about 150 minutes.

In view of the foregoing, the present invention accordingly enables the preparation of a CZ single crystal silicon wafer, or a silicon structure comprising a substrate derived from such a wafer, wherein the concentration of thermal donors [TD] and acceptors [A] are such that the ratio, [TD]:[A], of the two is between about 0.8:1 and about 1.2:1, and optionally is between about 0.85:1 and 1.15:1, between about 0.9:1 and 1.1:1, or between about 0.95:1 and 1.05:1. For example, this ratio may be about 0.8:1, about 0.85:1, about 0.9:1, about 0.95:1, about 1:1, about 1.05:1, about 1.1:1, about 1.15:1, or about 1.2:1. In one particular embodiment, however, the ratio is something other than 1:1.

Referring now to FIGS. 10a to 10d, it is to be noted that the process of the present invention preferably enables a resistivity (i.e., the ration [TD]:[A], or a resistivity value as recited elsewhere herein) to be achieved in the heat treated CZ wafer, or substrate derived from a CZ wafer, throughout substantially all of the wafer or substrate (i.e., at least about 80%, 85%, 90%, 95% or even 100% of the CZ silicon wafer or substrate may be effectively converted to this high resistivity state); alternatively, however, at least about 20%, 30%, 40%, 50%, 60%, or even about 70% of the wafer or substrate is converted to this high resistivity state. Additionally, or optionally, a high resistivity region may be formed in the wafer, or substrate, which extends over at least about 20%, and preferably at least about 30%, 40%, 50%, 60%, 70%, 80%, 90% or even about 95% of the radial surface, and/or has a depth or thickness which is at least about 20%, and preferably at least about 30%, 40%, 50%, 60%, 70%, 80%, 90% or even about 95% of the wafer or substrate thickness. For example, in one preferred embodiment, the high resistivity region may extend over about 50% to about 95%, or about 70% to about 90%, of the surface of the wafer, or substrate, and preferably about 50% to about 95%, or about 70% to about 90%, of the thickness of the wafer, or substrate.

In this regard, it is to be understood that, with respect to the portion of the wafer or substrate that may be effectively converted to a high resistivity state by means of the thermal treatment of the present invention, any percentages recited above for the surface may be used in combination with any percentage recited above for thickness, and vice versa. Additionally, it is to be understood that any two percentages recited above for the surface (or thickness) may be used in combination to define a range, in accordance with the present invention.

In contrast to conventional methods of producing high resistivity CZ silicon, which focus on ways to minimize the concentration of thermal donors and acceptors in the single crystal silicon, the present invention enables essentially any CZ wafer to be utilized, provided the relationship between the oxygen concentration, boron concentration and heat treatment temperature are properly controlled (i.e., the relationship expressed in Equation (1a) is satisfied/maintained therein), and further provided that the temperature of the heat treatment is sufficiently high such that, as further detailed herein, thermal donors will be formed from the interstitial oxygen. Typically, however, the CZ single crystal silicon wafer, or the substrate of the silicon structure, that is subjected to the present heat treatment may have an initial resistivity (and thus boron concentration, as further detailed herein) of at least about 50 ohm-cm, and preferably may have an initial resistivity of at least about 100 ohm-cm, about 150 ohm-cm, about 200 ohm-cm, about 250 ohm-cm, about 300 ohm-cm or more. Accordingly, this starting wafer, or substrate of the starting silicon structure, may have an initial resistivity ranging from, for example, at least about 50 or 100 ohm-cm to less than about 300 ohm-cm, from about 125 to about 250 ohm-cm, or from about 150 to about 200 ohm-cm.

In this regard it is to be noted that the initial resistivity of the CZ silicon wafer, or the substrate of the silicon structure, may, in one preferred embodiment, essentially correspond to the boron concentration therein. As such, the above-noted resistivities may alternatively be viewed in terms of boron concentration, the resistivity and boron concentrations being inversely related (i.e., as the resistivity increases, the boron concentration decreases). Accordingly, the boron concentration of the wafer, or substrate of the silicon structure, may typically be less than about $2.6 \times 10^{14}$ cm$^{-3}$, and may preferably be less than about $1.3 \times 10^{14}$ cm$^{-3}$, about $8.7 \times 10^{13}$ cm$^{-3}$, about $6.5 \times 10^{13}$ cm$^{-3}$, about $5.2 \times 10^{13}$ cm$^{-3}$, about $4.3 \times 10^{13}$ cm$^{-3}$ or less. The starting wafer, or substrate of the starting silicon structure, may therefore have a boron concentration in the range of, for example, about $4.3 \times 10^{13}$ cm$^{-3}$ to about $2.6 \times 10^{14}$ cm$^{-3}$, about $5.2 \times 10^{13}$ cm$^{-3}$ to about $1.3 \times 10^{14}$ cm$^{-3}$, or about $6.5 \times 10^{13}$ cm$^{-3}$ to about $8.7 \times 10^{13}$ cm$^{-3}$.

Figure 11:
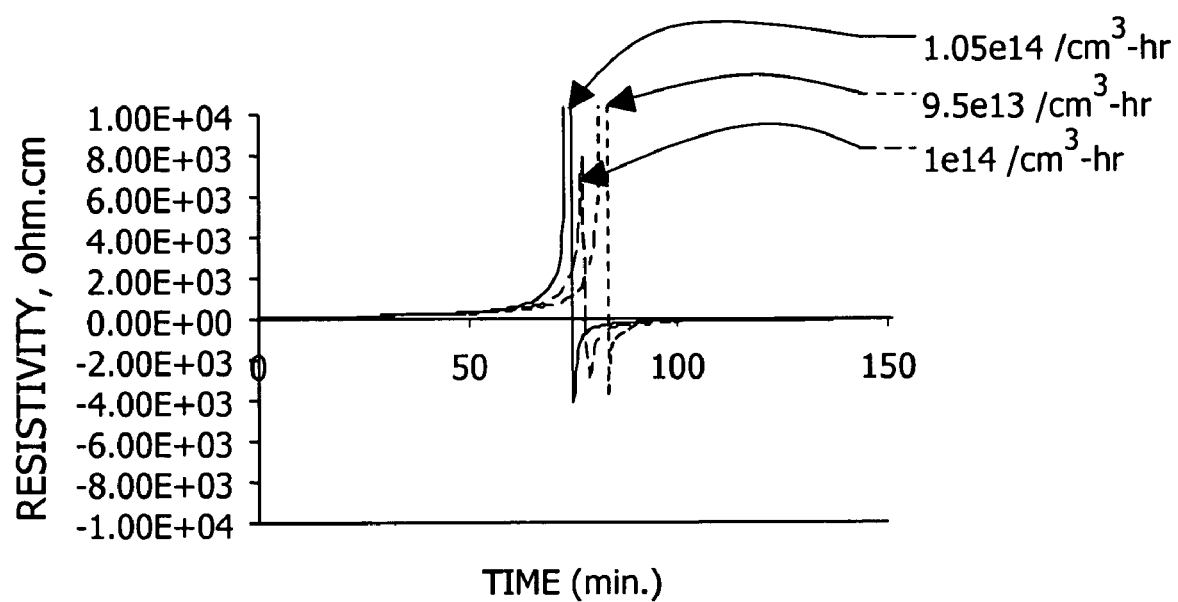
FIG. 11 is a graphical illustration which shows a calculated example in which, applying an $[Oi]^4$ dependence, the oxygen concentration of the population varies by only about +/−0.1 ppma (thermal donor rate approx. 100 ohm-cm).

It is to be still further noted that the starting wafer, or starting silicon structure, may additionally or optionally be limited by the oxygen concentration therein. More specifically, it is to be noted that the oxygen concentration of the wafer to be subjected to the present heat treatment, or substrate of the silicon structure that is to be subjected to the present heat treatment, is typically in the range of from at least about 5 ppma to less than about 20 ppma, and preferably is in the range of from about 6 ppma to about 18 ppma, from about 8 ppma to about 16 ppma, from about 10 to about 15 ppma, or even from about 12 ppma to about 14 ppma. (See, e.g., FIG. 11, from which it can be observed that the oxygen concentration required in order to achieve high resistivity increases rapidly as the initial resistivity drops below about 20 ohm-cm. FIG. 11 illustrates a calculated example in which, applying an $[Oi]^4$ dependence, the oxygen concentration varies only +/−0.1 ppma. Such a variation is within the measurement errors of the FTIR method to determine the oxygen concentration. However, in spite of the narrowness of this hypothetical range of oxygen concentration, there is practically no overlap in annealing times in which a high resistivity state is achieved.)

As further detailed elsewhere herein, the temperature of the heat treatment to be employed is preferably selected in cooperation with the manufacturing process of the desired silicon structure (e.g., a desired electronic or electrical device); that is, the temperature of the heat treatment is preferably a temperature that is employed in the silicon structure manufacturing process, or is tolerable within the manufacturing process (i.e., may be used in the manufacturing process without causing unacceptable changes in the overall process or resulting silicon structure obtained therefrom). More preferably, the heat treatment step of the present invention will itself be carried out as part of the actual manufacturing process; that is, a CZ single crystal silicon wafer to be employed in the manufacture of a silicon structure (e.g., a device) will preferably have a boron concentration and an oxygen concentration that are suitably paired, in accordance with the relationship disclosed herein (see, e.g., Equation (1a), above), such that, when subjected to a heat treatment commonly employed in the manufacturing process of a desired silicon structure (e.g., a device), the resulting high resistivity structure of the present invention will be obtained.

With respect to the temperature of the heat treatment, however, it is to be noted that, generally speaking, the temperature employed in the heat treatment will typically be greater than about 480° C. and less than about 600° C. (e.g., a temperature of less than about 590° C., 580° C., 570° C., 560° C., 550° C., 540° C., 530° C., 520° C., 510° C., 500° C., or even about 490° C.). As such, the temperature of the heat treatment may be in the range of, for example, greater than about 480° C. to less than about 600° C., from greater than about 485° C. or 490° C. to less than about 580° C., from greater than about 500° C. to less than about 575° C., from greater than about 510° C. to less than about 550° C., or from greater than about 520° C. to less than about 530° C.

The duration of the heat treatment may vary, as the temperature, boron concentration and/or oxygen concentration changes. A suitable duration for a given set of condition (i.e., temperature, boron concentration and/or oxygen concentration) may be determined experimentally by means common in the art. Typically, however, the duration of the present heat treatment may be greater than about 5 minutes and less than about 250 minutes, and preferably less than about 200 minutes, about 150 minutes, about 125 minutes, about 120 minutes, about 110 minutes, about 100 minutes, about 90 minutes, about 80 minutes, about 70 minutes, about 60 minutes, about 50 minutes, about 40 minutes, about 30 minutes, or even about 20 minutes. Accordingly, the wafer, or silicon structure, may be subjected to the present heat treatment for a duration of about 10 to about 250 minutes, from about 15 to about 200 minutes, from about 20 to about 150 minutes, from about 25 to about 125 minutes, from about 30 to about 120 minutes, from about 35 to about 110 minutes, from about 40 to about 100 minutes, from about 50 to about 90 minutes, or from about 60 to about 80 minutes. In this regard it is to be noted that, typically, higher temperatures are employed with shorter durations, and vice versa.

In accordance with the present process, it is to be noted that the resulting heat treated CZ wafer, or CZ substrate of the heat treated silicon structure, may have a resistivity after said heat-treatment of at least about 500 ohm-cm, about 750 ohm-cm, about 1000 ohm-cm, about 1500 ohm-cm, about 2000 ohm-cm, about 2500 ohm-cm, about 3000 ohm-cm, about 3500 ohm-cm, about 4000 ohm-cm, about 4500 ohm-cm, about 5000 ohm-cm, or more (e.g., about 5500 ohm-cm, about 6000 ohm-cm, about 6500 ohm-cm, about 7000 ohm-cm, about 7500 ohm-cm, about 8000 ohm-cm, about 8500 ohm-cm, about 9000 ohm-cm, about 9500 ohm-cm, about 10000 ohm-cm, about 20000 ohm-cm, or even about 30000 ohm-cm).

In this regard it is to be noted that this high resistivity may extend across the diameter or width, and/or thickness, of the wafer or substrate. Alternatively, however, a high resistivity region may be formed in the wafer, or substrate, which extends over at least about 20%, and preferably at least about 30%, 40%, 50%, 60%, 70%, 80%, 90% or even about 95% of the radial surface, and/or has a depth or thickness which is at least about 20%, and preferably at least about 30%, 40%, 50%, 60%, 70%, 80%, 90% or even about 95% of the wafer or substrate thickness. For example, in one preferred embodiment, the high resistivity region may extend over about 50% to about 95%, or about 70% to about 90%, of the surface of the wafer, or substrate, and preferably about 50% to about 95%, or about 70% to about 90%, of the thickness of the wafer, or substrate.

In this regard it is to be still further understood that any number recited above for a given parameter, be it for a particular ratio, concentration, temperature, time, resistivity, etc., may be used in combination with any other number for one or more other parameters noted herein, without departing from the scope of the present invention. Additionally, it is to be understood that any two numbers recited above for a given parameter, be it for a particular ratio, concentration, temperature, time, resistivity, etc., may be used in combination to define a range of ratios, concentrations, temperature, times, resistivities, etc., in accordance with the present invention and without departing from the scope thereof.

b. Cooling after Thermal Treatment

Experience to-date suggest that, in at least some instances, the cool conditions (e.g., cooling rate) after the thermal treatment detailed herein above may not be narrowly critical to the present invention. For example, some experiments have been made on the effect of cooling rate following annealing a silicon wafer at a temperature suitable for creating the high resistivity state detailed herein. Comparison of samples rapidly cooled (e.g., deliberately quenched on to a large metal plate) versus samples cooled more slowly (e.g., naturally cooled by pulling from a conventional tube furnace) revealed no discernable differences. Accordingly, the possibility of using controlled cooling, particularly through rather low temperatures (e.g., temperature of perhaps as low as about 250° C., about 200° C., about 150° C., or even about 100° C.), may be optionally used to improve resistivity control.

Additionally, or alternatively, it is to be noted that, after a wafer or substrate has been subject to the thermal treatment detailed herein, it may optionally be cooled to a temperature of between greater than about 75° C. and less than about 250° C., or between about 100° C. and less than about 200° C., and held at this temperature, or within this temperature range, for some period of time (e.g., a few minutes to about an hour, such as about 5 minutes to less than about 60 minutes, or about 10 minutes to less than about 45 minutes, or about 15 minutes to less than about 30 minutes).

c. Relaxation of Resistivity after Thermal Treatment

It is also to be noted that, in some instances, there is relaxation of resistivity, which occurs after annealing. For example, the resistivity of a sample, after thermal treatment, may drift at a given temperature, such as room temperature, by amounts of about 10%, about 20%, about 30%, about 40%, or even about 50%, for a for a period of time (e.g., a few tens of hours, such as about 10 hours, about 25 hours, about 50 hours, about 75 hours, about 100 hours or more, or up to about 5 days or even a week), before it settles down to its final or substantially stable value. Experience to-date suggests sample resistivity, following the thermal treatment detailed herein, actually drifts upward, to higher values, over time. Sometimes, several days, or even a week, may pass before the final, or substantially stable, value of resistivity may be determined. The measurements described here have included such a room temperature stabilization period. It is to be further noted that experience to-date suggests resistivity relaxation rates may be enhanced by raising the temperature of the sample slightly above room temperature (e.g., by raising relaxation temperature to greater than about 25° C. and less than about 75° C., or greater than about 40° C. and less than 50° C.).

3. Alternative Approach—a Two Step Anneal Process

Some experiments to-date also indicate that it may alternatively be advantageous to apply a two step anneal in place of the single step anneal at a properly chosen temperature. The two step process involves the addition of a lower temperature pre-anneal step, prior to the high resistivity anneal set forth herein above at whatever temperature that is determined to be suitable for the wafer, or wafer ensemble, in question. In at least some instances, both the time and the process window to convert such wafers to the high resistivity state may be improved with this two step approach; in other words, it may be that less annealing time in the higher temperature range may be used and/or a wider parameter window, in terms of the three coupled parameters, may be achieved.

The purpose of the pre-anneal is to generate a relatively large concentration of purely 'normal' thermal donors (i.e., at temperatures less than about 480° C.), in concentrations near to or exceeding the concentration of boron in the wafer prior to the high resistivity anneal. It may be advantageous to do this at a temperature at which normal thermal donors are generated most rapidly. The maximum rates of thermal donor generation typically occurs at temperatures between about, for example, greater than about 425° C. and less than about 460° C., or about 435° C. about 450° C.

The amount of time at these temperatures needed to create sufficiently high concentrations of thermal donors will vary with the boron and oxygen concentrations. It may, however, be easily determined experimentally by monitoring sample resistivity over time. The concentration of thermal donors exceeds that of the boron concentration when the sample converts from p-type to n-type.

Following the installation of a sufficiently high concentration of normal thermal donors in the low temperature regime, a higher temperature (e.g., a temperature greater than about 480° C.) anneal (i.e., an appropriate temperature for the oxygen and boron concentration of the wafers in question) is then applied to these wafers, in order to convert these wafers to a high resistivity state. Such a two step embodiment may be employed either after or before metallization, as described elsewhere herein (for the single step embodiment).

In this regard it is to be noted that, in most cases, the total time for such a two step process may exceed that of the one step process. Possible advantages of such a treatment, however, may include improved process stability and less time spent at temperatures greater than about 480° C.

4. Assemblies and Variability Therein

The process of the present invention enables the preparation of an assembly of CZ silicon structures, or CZ wafers, as set forth herein; that is, the present invention enables an assembly of CZ silicon structures, or CZ wafers, to be prepared, such that each of the structures or wafers present therein possesses the high resistivity features of the present invention. Such an assembly may contain, for example, at least about 10 structures or wafers, and may optionally contain at least about 20, about 30, about 40, about 50 or more structures or wafers.

In accordance with the present invention, the oxygen concentration of two or more of these wafers, or the substrates of these structures, in the above-noted assembly may differ by at least about 0.1 ppma, about 0.5 ppma, about 1 ppma, about 1.5 ppma, about 2 ppma, about 2.5 ppma, about 3 ppma, about 3.5 ppma, about 4 ppma, about 4.5 ppma, or about 5 ppma. Additionally, or alternatively, the oxygen concentration of each of said wafers or substrates and in the above-noted assembly may be within the range of about 5 ppma to about 20 ppma, from about 8 ppma to about 15 ppma, about 10 to about 14 ppma, or about 11 to about 13 ppma.

Also in accordance with the present invention, the boron concentration of two or more of these wafers, or the substrates of these structures, in the above-noted assembly may differ by at least about 1%, about 2%, about 3%, about 4%, about 5%, about 6%, about 7%, about 8%, about 9%, about 10%, about 12%, about 14%, about 16%, about 18%, or about 20%. Additionally, or alternatively, the boron concentration of two or more of said wafers or substrates in said assembly may differ by at least about 1% to less than about 20%, from about 2% to about 18%, from about 4% to about 16%, from about 6% to about 14%, or from about 8% to about 12%.

In this regard it is to be noted that a population of such substrates, or wafers, with a distribution of [Oi] and/or [B] in the population, even a distribution larger than the ranges defined above, may be optionally measured and sorted into two or more groups designed to be subjected to thermal treatments at different temperatures. In this way, the added cost of tightly controlling wafer, or substrate, specifications may be offset by an added complication of two or more different annealing schedules.

In this regard it is to be still further noted that, with respect to variability in oxygen concentration and/or boron concentration, variations may also exist within a given wafer or substrate, as well. More specifically, in one embodiment, the present invention is directed to wafer, and/or a process for the preparation thereof, wherein the wafer has a front surface and a back surface, a circumferential edge, a central axis which is substantially perpendicular to each of said front and back surfaces, and a radius extending from said central axis substantially parallel to each of said front and back surfaces and toward the circumferential edge, said wafer having an oxygen concentration, and/or a boron concentration, which varies along said radius. Alternatively, the present invention may be directed to a structure having a single crystal silicon substrate, said substrate of the structure having a front stratum and a back stratum, a circumferential edge, a central axis which is substantially perpendicular to each of said front and back stratums, and a radius extending from said central axis substantially parallel to each of said front and back stratums and toward the circumferential edge, said substrate having an oxygen concentration, and/or a boron concentration, which varies along said radius. In either of such embodiments, the oxygen concentration along said radius may vary by at least about 0.1 ppma, about 0.5 ppma, about 1 ppma, about 1.5 ppma, about 2 ppma, about 2.5 ppma, about 3 ppma, about 3.5 ppma, about 4 ppma, about 4.5 ppma, or about 5 ppma (the concentration for example ranging from about 5 ppma to about 20 ppma, from about 8 ppma to about 15 ppma, from about 10 to about 14 ppma, or from about 11 to about 13 ppma). Additionally, or alternatively, the boron concentration along said radius may vary by at least about 1%, 2%, 3%, 4%, 5%, 6%, 7%, 8%, 9%, 10%, 12%, 14%, 16%, 18% or 20% (the concentration for example ranging from at least about 1% to less than about 20%, from about 2% to about 18%, from about 4% to about 16%, from about 6% to about 14%, or from about 8% to about 12%).

5. Other Wafer Embodiments

It is to be noted that wafers subjected to the thermal treatment detailed herein may optionally be an epitaxial or a SOI wafer; that is, the wafer subjected to the process of the present invention may optionally have an epitaxial layer present on a surface thereof, or it may be part of a multi-layered structure, wherein the handle wafer thereof has high resistivity. Accordingly, in these embodiments, the joint specification of the three parameters refers to the characteristics of the epitaxial substrate, or the substrate below the buried oxide layer of the SOI structure (i.e., the handle wafer of the structure). The epitaxial or SOI device layer itself may be of essentially any resistivity. Additionally, the oxygen concentration of an epitaxial layer may be within conventional ranges known in the art, and thus naturally low.

It is to be further noted that epitaxial deposition may be performed by means known in the art. Additionally, the semiconductor-on-insulator structure may also be prepared using means known in the art (e.g., hydrogen-implantation or bonded applications). The semiconductor-on-insulator composite may be formed, for example, as described in Iyer et al., U.S. Pat. No. 5,494,849.

6. Device Manufacturing

It is to be noted that, although silicon wafers with high resistivity can be manufactured as described above wherein the boron concentration, oxygen concentration, and annealing temperature are controlled, such silicon wafers would still undergo device manufacturing procedures in order to have a finished high resistivity semiconductor device product. Semiconductor device manufacturing processes subject silicon wafers to thermal heating and cooling, and devices are added to the surface of the silicon wafers. This heating and cooling normally affect the concentration and distribution of boron and oxygen, and may reduce the resistivity of silicon wafers wherein high resistivity is obtained by means as set forth herein; that is, a high resistivity silicon wafer manufactured by the process set forth herein may lose its high resistivity upon being subjected to a device manufacturing process. Therefore, one aspect of the present invention involves manipulating the device manufacturing process so that high resistivity semiconductor devices (i.e., a device typically having a resistivity greater than about 1 kohm-cm) can be manufactured for use in electronic devices. Such devices include, for example, electronic devices, such as integrated circuits or microchips, as well as passive electrical devices, such as planar inductors or RC filters.

Accordingly, in one embodiment, the present invention is directed to a method for manufacturing a semiconductor device containing a silicon wafer, wherein the annealing temperature, concentration of boron, and concentration of oxygen are maintained in accordance with the relationship set forth in Equation (1a) provided elsewhere herein, and/or are in accordance with the ranges provided elsewhere herein.

As previously noted, the high resistivity state created by the annealing process is typically not stable to high temperature heat treatments. Accordingly, at elevated temperatures the effect may essentially be erased. Therefore, the specific heat treatment that is applied to wafers of a given specification, in order to converts them to the highly resistive state, is, in at least some embodiments, preferably applied at or near the end of a device manufacturing process. Most preferably, this heat treatment typically, but not necessarily, acts as the usually-required "post metallization anneal" step of a device making process. However, although the effects of the process of the present invention may be lost if the resulting wafer, or silicon structure, is subjected to a subsequent heating step involving a temperature that is too high, or a duration that is too long, the high resistivity state or effect can be returned or recovered by reheating the wafer or structure, in a manner consistent with the present invention.

Figure 12:
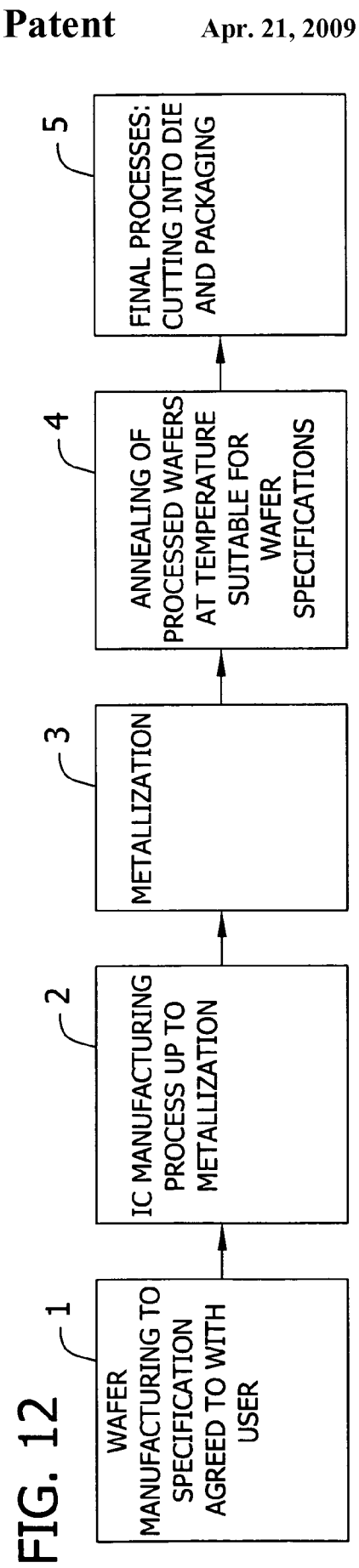
FIG. 12 is a flow chart or block diagram which illustrates an embodiment of the present invention, wherein the thermal treatment detailed herein is performed after a metalization step in the device manufacturing process.
Figure 13:
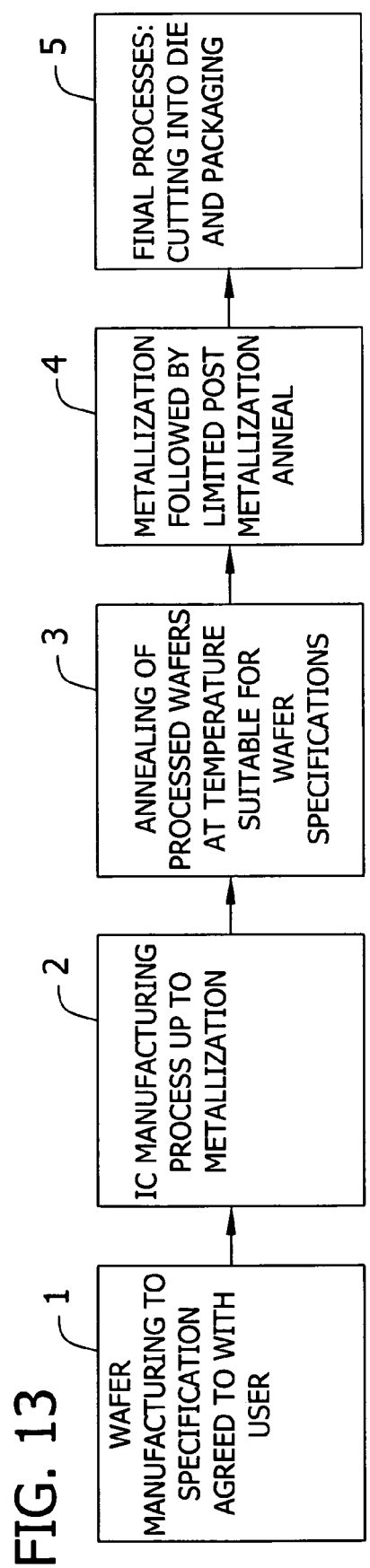
FIG. 13 is a flow chart or block diagram which illustrates an alternative embodiment of the present invention, wherein the thermal treatment detailed herein is performed before a metalization step in the device manufacturing process.

It is to be further noted that a basic embodiment of a device manufacturing process, consistent with the present invention, may be illustrated by the block diagram provided in FIG. 12. Alternatively, however, as illustrated by the block diagram in FIG. 13, it may be desirable to apply the high resistivity annealing treatment prior to metallization. For instance, the final finished device in question may be unstable to even the minimum temperature needed to achieve the desired high resistivity state or effect (thought to be, for example, about 480° C.). If so, a post metallization anneal may then be performed, but it is preferably limited to a temperature not much greater than about 400° C. (e.g., about 425° C. or about 450° C.) and for relatively short periods of time (e.g., up to, for example, a maximum of about 10 to about 40 minutes, or about 20 to about 30 minutes), in order to avoid reducing or eliminating the high resistivity effect. However, it may be possible to extend the parameters of a subsequent post-metalization heat treatment to higher temperatures and/or longer times, if the wafers have a very low oxygen concentration.

7. Control of Oxygen Precipitation During the Device Process

It is to be noted that the oxygen concentration which is important for the present invention is the interstitial oxygen concentration after the process for making the device. Accordingly, if there is any measurable loss of oxygen to oxygen precipitation, this is to be taken into account. For most applications typically of interest here (e.g., very high speed, and hence very small, devices), the "thermal budgets" for the processes may be limited. In other words, there may be a limited scope for oxygen loss to precipitation. Thus, the initial oxygen concentration may be essentially equal, for all intents and purposes, to the final oxygen concentration. If this is not the case, then some care may be exercised to insure uniform oxygen precipitation behavior, which may mean, for example, in at least some instances, subjecting the wafer or structure to a "tabula rasa" thermal treatment (i.e., a process for no oxygen precipitation, such as that disclosed in U.S. Pat. No. 6,336,968, which is incorporated herein by reference), or a MDZ thermal treatment (i.e., a process for controlling oxygen precipitation, such as that disclosed in U.S. Pat. Nos. 5,994,761; 6,204,152; 6,191,010; 6,284,384 and 6,236,104, which are incorporated herein by reference).

8. Measurement Techniques

In accordance with the present invention, it is to be noted that references to resistivity may refer to the surface resistivity, as measured by a surface four point probe using means known in the art, and/or may refer to the resistivity as determined at least about 50, about 75, about 100, about 125, about 150, about 175, about 200 microns or more below the wafer surface, or substrate stratum, as measured by spreading resistance using means known in the art.

Dopant concentrations may be measured by SIMS, Hall Effect, and/or Infrared Spectroscopic techniques, which are generally known in the art. Thermal donors in silicon may be detected by Hall Effect and/or infrared absorption spectroscopy, again using means known in the art.

9. CZ Wafer Diameter

It is to be noted that, the CZ wafers prepared in accordance with the present invention typically have a nominal diameter of at least about 150 mm, and preferably have a nominal diameter of at least about 200 mm, about 300 mm, or more.

10. Exemplary Process Embodiments

In one preferred embodiment of the present invention, a high resistivity wafer, or substrate of a structure, as defined herein above, is formed by subjecting a CZ silicon wafer, or silicon structure comprising a CZ wafer as a substrate, which has an interstitial oxygen concentration of about 12 to about 15 ppma and a boron concentration of about $2.75 \times 10^{14}$ cm$^{-3}$ to about $3.25 \times 10^{14}$ cm$^{-3}$, to a heat-treatment for about 10 to about 100 minutes at about 505 to about 515° C. The resistivity of the resulting wafer, or the substrate of the silicon structure, is in the range of about 1200 to about 1900 ohm-cm.

In another preferred embodiment of the present invention, a high resistivity wafer, or substrate of a structure, as defined herein above, is formed by subjecting a CZ silicon wafer, or silicon structure comprising a CZ wafer as a substrate, which has an interstitial oxygen concentration of about 12 to about 15 ppma and a boron concentration of about $2.75 \times 10^{14}$ cm$^{-3}$ to about $3.25 \times 10^{14}$ cm$^{-3}$, to a heat-treatment for about 80 to about 150 minutes at about 500 to about 525° C. The resistivity of the resulting wafer, or the substrate of the silicon structure, is in the range of about 500 to about 2000 ohm-cm.

In yet another preferred embodiment of the present invention, a high resistivity wafer, or substrate of a structure, as defined herein above, is formed by subjecting a CZ silicon wafer, or silicon structure comprising a CZ wafer as a substrate, which has an interstitial oxygen concentration of about 8 to about 12 ppma and a boron concentration of about $5.50 \times 10^{13}$ cm$^{-3}$ to about $6.00 \times 10^{13}$ cm$^{-3}$, to a heat-treatment for about 60 to about 80 minutes at about 490 to about 495° C. The resistivity of the resulting wafer, or the substrate of the silicon structure, is in the range of about 1500 to about 2800 ohm-cm.

In yet another preferred embodiment of the present invention, a high resistivity wafer, or substrate of a structure, as defined herein above, is formed by subjecting a CZ silicon wafer, or silicon structure comprising a CZ wafer as a substrate, which has an interstitial oxygen concentration of about 8 to about 12 ppma and a boron concentration of about $5.50 \times 10^{13}$ cm$^{-3}$ to about $6.00 \times 10^{13}$ cm$^{-3}$, to a heat-treatment for about 60 to about 80 minutes at about 490 to about 495° C. The resistivity of the resulting wafer, or the substrate of the silicon structure, is in the range of about 1500 to about 2500 ohm-cm.

In yet another preferred embodiment of the present invention, a high resistivity wafer, or substrate of a structure, as defined herein above, is formed by subjecting a CZ silicon wafer, or silicon structure comprising a CZ wafer as a substrate, which has an interstitial oxygen concentration of about 6 to about 8 ppma and a boron concentration of about $1.75 \times 10^{14}$ cm$^{-3}$ to about $2.25 \times 10^{14}$ cm$^{-3}$, to a heat-treatment for about 40 to about 110 minutes at about 510 to about 535° C. The resistivity of the resulting wafer, or the substrate of the silicon structure, is in the range of about 350 to about 11,000 ohm-cm.

In yet another preferred embodiment of the present invention, a high resistivity wafer, or substrate of a structure, as defined herein above, is formed by subjecting a CZ silicon wafer, or silicon structure comprising a CZ wafer as a substrate, which has an interstitial oxygen concentration of about 6 to about 8 ppma and a boron concentration of about $4.5 \times 10^{13}$ cm$^{-3}$ to about $5.0 \times 10^{13}$ cm$^{-3}$, to a heat-treatment for about 10 to about 70 minutes at about 495 to about 530° C. The resistivity of the resulting wafer, or the substrate of the silicon structure, is in the range of about 800 to about 19,500 ohm-cm.

Additionally, in these or yet other embodiments set forth herein, it is to be noted that the silicon wafer, or the substrate of the silicon structure, may optionally be doped with something other than gold (Au); that is, in some embodiments of the present invention, the high resistivity wafer, or substrate of the high resistivity silicon structure, is not gold-doped.

EXAMPLES

The following Examples are presented for illustration purposes only. Accordingly, they are not to be viewed in a limiting sense.

Example 1

Figure 14:
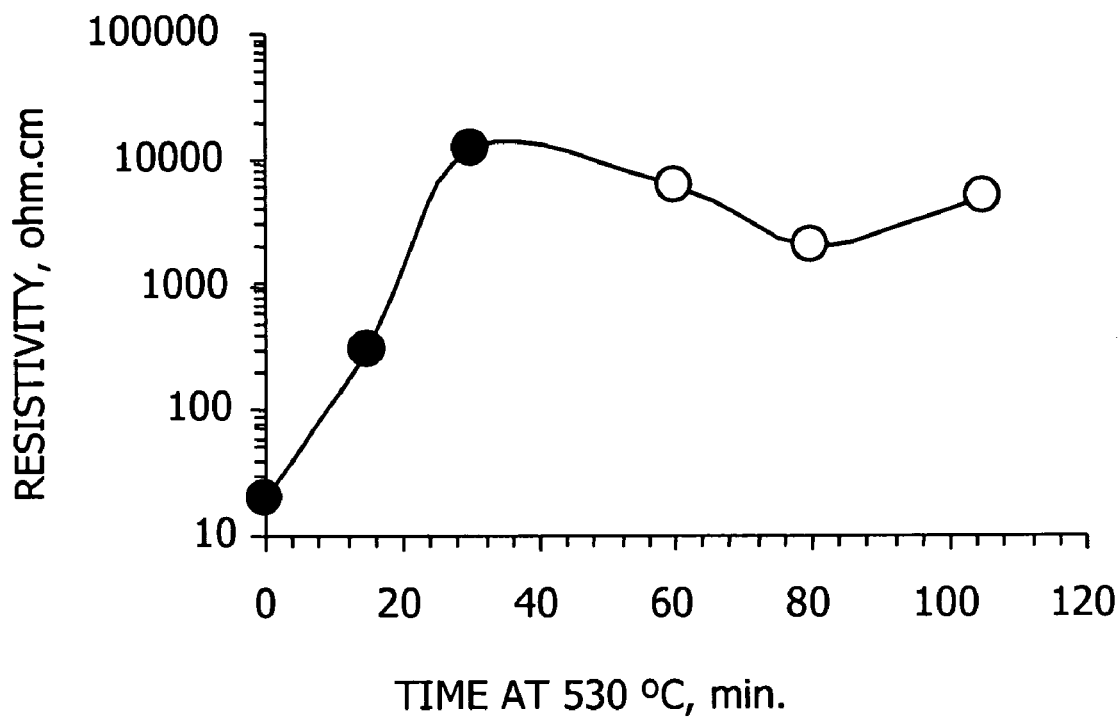
FIG. 14 is a graphical illustration of the creation of a high resistivity state using the approximate annealing temperature derived from FIGS. 9a and 9b, knowing the approximate sample [B] and [Oi]. The solid dots refer to n-type conductivity. The open dots refer to p-type conductivity.

An example of the results that may be obtained using the techniques of the present invention, and as set forth in Equation (1a) herein, is found in FIG. 14. The resistivity data in FIG. 14 was obtained from Hall Effect determinations of carrier concentrations at different stages during the annealing of a wafer under conditions defined in this invention. In this example, a sample initially having a resistivity of about 300 ohm-cm (i.e., [B] equal to about 4e13 cm$^{-3}$), and an oxygen concentration of about 6.5e17 cm$^{-3}$, was used. The appropriate annealing temperature to achieve the high resistivity effect in a sample of this type was determined to be about 530° C. In this particular example, previously generated thermal donors were also present in the sample and the sample was actually n-type prior to the annealing (due to a prior 3 hour annealing at about 450° C.).

FIG. 14 shows the development of the resistivity, as deduced from the Hall Effect measurements, of this sample over time during annealing at about 530° C. The initial n-type sample relaxes quickly toward a very high value of resistivity. This high value of resistivity (2-20 kohm-cm) is persistent for about two hours of annealing. This is a rather surprising result, and different to that expected from "normal" thermal donors. Furthermore, measurements taken at different locations (e.g., radial locations) within the wafer, and even with other wafers of a similar type, showed a similar behavior. Similar behavior has been observed in many samples over a wide range of appropriate parameter combinations, and more examples are provided herein below.

It is to be noted that spreading resistance measurements throughout the depth of such samples show that the bulk resistivity is very uniform. This is also very different to the behavior of conventional thermal donors. In the case of conventional thermal donors, when near the transition from p-type to n-type material, the natural variation of oxygen concentrations due to striations (e.g., with typical periods of about 100 microns) in its incorporation during growth are enough to cause the wafer to vary throughout the wafer thickness, even flipping from n-type to p-type throughout the thickness, in sync with the oxygen striations. Notably, high resistivity material produced by the technique of the present invention appears to be unaffected by oxygen (or boron) concentration striations.

Example 2

Figure 15:
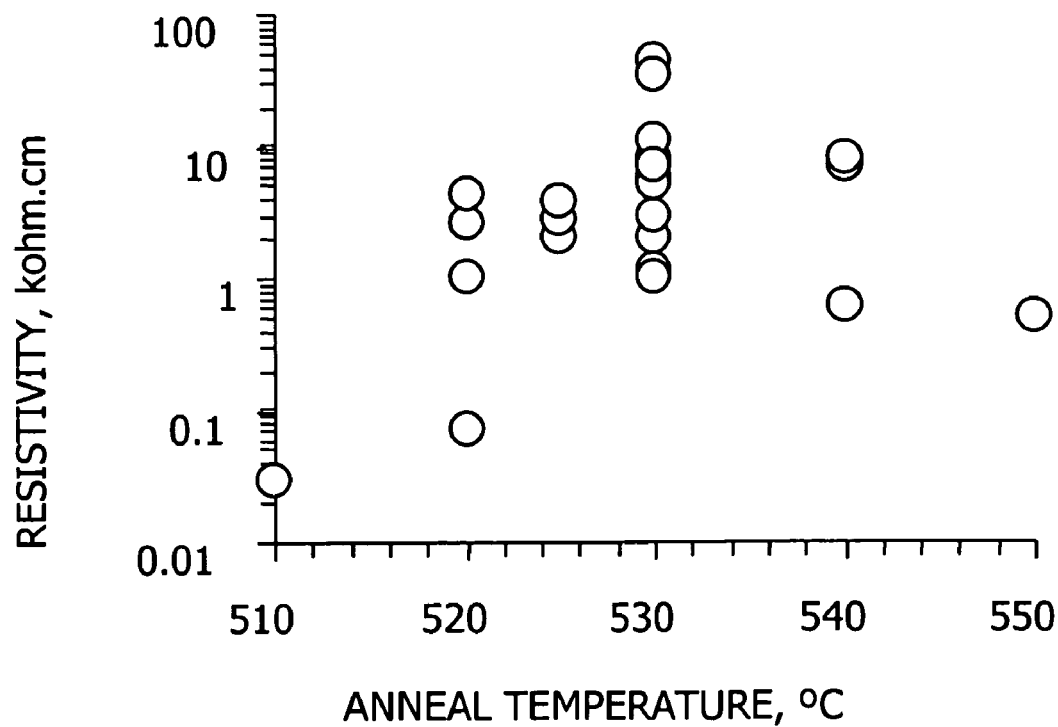
FIG. 15 is a graphical illustration of saturated resistivity values obtained with samples similar to those used for the results of FIG. 14, but varying the temperature around the central or "ideal" value (for this particular example) of about 530° C. A broad window in the acceptable anneal temperature is observed.
Figure 16A:
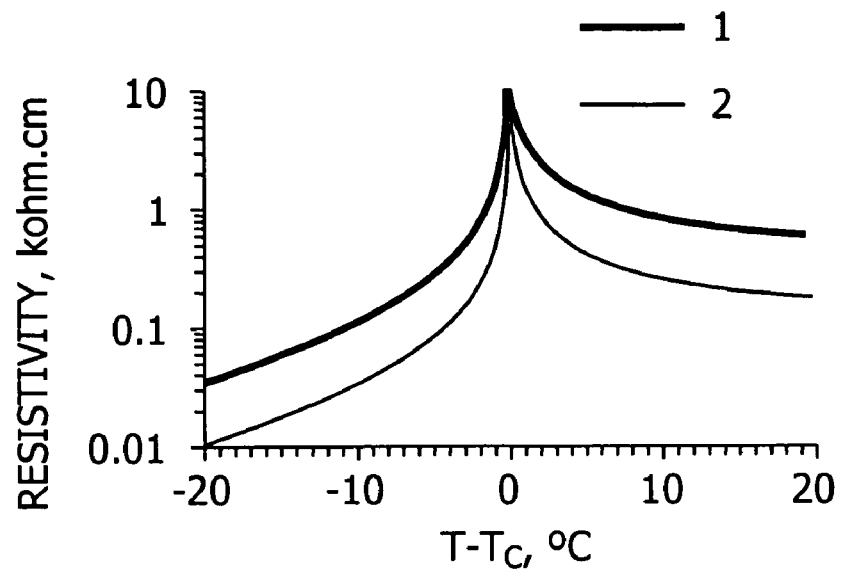
FIGS. 16a and 16b are graphical illustrations of calculated resistivities for excursions or variations from the "ideal" temperature for compensation within a simple model involving only "normal" thermal donors and no "reconstructing" thermal donors.
Figure 16B:
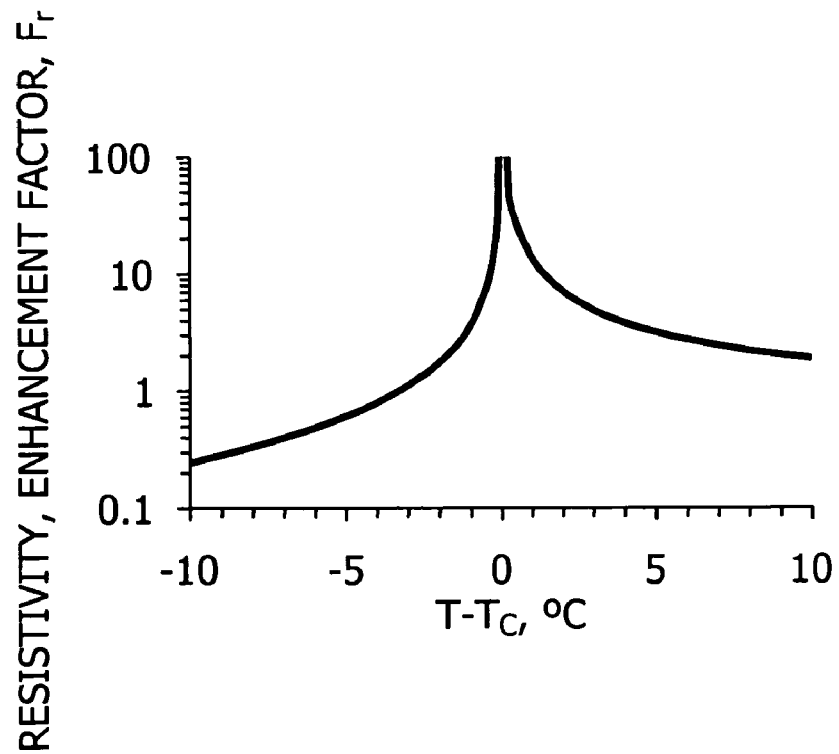

Further to Example 1, above, and to demonstrate further the highly desirable "approximate" matching of conditions afforded by the present invention (and in accordance with Equation (1a) presented herein), samples similar to that used in Example 1 were annealed at temperatures near the calculated temperature of, in this instance, about 530° C. for this type of material. The results of the saturated resistivity following the anneal are shown in FIG. 15.

Example 3

Comparative Example

This Example is to illustrate how the resistivity versus temperature curve, ρ(T), would look without a self-compensation effect.

In a simple "normal" case, when there is no reconstruction-based self-compensation, the resistivity is controlled essentially only by the achieved difference $N=2N_{td}(T,C)-N_A$. At $N>0$, the carrier (electron) concentration is $n=N$. At $N<0$, the carrier (hole) concentration is $p=-N$. More generally, at a very small difference N, the resistivity may approach the intrinsic value, and a more general expression for n and p may be used in this case (which is seldom to be met):

$$n = N/2 + [(N/2)^2 + n_i^2]^{1/2}, \quad (2)$$

$$p = -N/2 + [(N/2)^2 + n_i^2]^{1/2}, \quad (3)$$

where $n_i$ is the intrinsic electron concentration (close to about $1.3 \times 10^{10}$ cm$^{-3}$ at room temperature). The resistivity is $\rho = 1/(e\mu_n n + e\mu_p p)$. The drift mobilities $\mu_n$ and $\mu_p$ are about 1,550 cm$^2$/sV and about 450 cm$^2$/sV, respectively (at room temperature).

The donor/acceptor difference, N, is convenient to write using the temperature $T_c$ of the required (in absence of the newly discovered "self-compensation" effect) precise coincidence of $N_A$ and $2N_{td}$:

$$N = N_A[\exp(E_{td}/kT - E_{td}/kT_c) - 1]. \quad (4)$$

Thus, quantity is almost a universal function of the temperature deviation $T-T_c$, since the parameter $E_{td}/kT_c^2$ does not substantially change within a narrow range of $T_c$.

The calculated dependence of the achieved resistivity, in dependence of the temperature deviation from the temperature $T_c$ of precise compensation, is shown in FIG. 15a. For a boron concentration $N_A$, typical values were assumed: about $3 \times 10^{13}$ cm$^{-3}$ (which correspond to the starting resistivity $\rho_A$ equal to about 463 ohm-cm) and about $10^{14}$ cm$^{-3}$ (resistivity is about 139 ohm-cm). The compensation temperature $T_c$ was taken to be about 520° C. It is to be noted here that the result is almost insensitive to $T_c$. The plot of FIGS. 15a and 15b gives an impression of the absolute value of achieved resistivity. However, the achieved carrier concentration is actually scaled by $N_A$, according to Equation (4), above, and the resistivity is accordingly scaled by the initial value $\rho_A$. Therefore, there is a resistivity enhancement factor $F_r$ (the ratio of the achieved resistivity to the initial resistivity) that is independent of the initial resistivity and sensitive only to the temperature deviation $T-T_c$. The enhancement factor is plotted in FIG. 15b.

Examples 4-9

Additional data was collected from examining many examples of creating the high resistivity state from a variety of boron and oxygen concentration combinations, using the techniques and relationships outlined herein (see, e.g., Equation (1a)). Provided below are some data charts showing results of experiments in which an "ideal" or preferred anneal temperature was calculated for the given [Oi] and [B] of the wafer in question (in accordance with Equation (1a)). Samples were taken from this wafer and then annealed at a temperature near this temperature for a variety of times. Other samples were annealed at other temperatures in the vicinity of the "ideal" or preferred temperature for a variety of times. In this way further data regarding the window size, or range of acceptable variations, was obtained. It is to be noted that some of the samples were given a pre-anneal at 450° C., in order to generate a high concentration of "stable" or normal thermal donors prior to the self-compensation anneal at the calculated temperature.

Examples of the increase of resistivity achieved by applying this technique are given below. In these examples, wafers of various combinations of oxygen and boron concentration were collected. The actual oxygen and boron concentration at the center position of each wafer in the test is shown in the heading to each individual data chart (i.e., Tables 1-6). Using the technique described above, an annealing temperature appropriate to the particular combination of oxygen and boron concentration was determined. This calculated temperature is also listed in the heading to each chart. The wafers were then cut into small pieces and each piece was given an individual anneal at a temperature at or near the calculated temperature for the wafer it came from for certain periods of time. The time evolution of sample resistivity during annealing in a temperature range around the ideal calculated temperature was determined by four point probe measurements following the anneal (some period of room temperature storage—on the order of at least a few days—was allowed to happen between the anneal and the four point probe measurements—see below).

The resistivity results obtained are indicated in the box appropriate to the annealing time and temperature. In each of the sample boxes, an indication of whether the sample was determined to be n-type or p-type is also provided. However, it is to be noted that, at very high values of resistivity (e.g., greater than about 1 kohm-cm), the determination of type may be somewhat questionable using the method employed here.

By investigating a wide range of boron and oxygen concentration combinations, the general principle of the present invention was confirmed. A rather wide variety of calculated "ideal" or preferred temperatures are covered here (from about 495° C. to about 530° C.) with this sample collection. In general, the agreement with the model is good and the window in temperature found is uniformly large.

Example 4

TABLE 1

Resistivity (in ohm-cm) of samples from wafer 04246959, with a pre-anneal at about 450° C. for three hours; Initial resistivity was about 43 ohm-cm; [B] was about 3.03 × 10$^{14}$ cm$^{-3}$; [Oi] was about 14 ppma (7 × 10$^{17}$ cm$^{-3}$); and T$_{calc}$ was about 510° C.

| Time | 505° C. | 510° C. | 515° C. |
|---|---|---|---|
| 10 min | 1848 | 1860 | 1600 |
|  | N-, p- | n- | n- |
| 20 min | 1705 | 1613 | 1599 |
|  | n-, p- | n- | n- |

TABLE 1-continued

Resistivity (in ohm-cm) of samples from wafer 04246959, with a pre-anneal at about 450° C. for three hours; Initial resistivity was about 43 ohm-cm; [B] was about $3.03 \times 10^{14}$ cm$^{-3}$; [Oi] was about 14 ppma ($7 \times 10^{17}$ cm$^{-3}$); and $T_{calc}$ was about 510° C.

| Time | 505° C. | 510° C. | 515° C. |
|---|---|---|---|
| 30 min |  | 1543 | 1207 |
|  |  | n-, p- | n- |
| 40 min | 1770 | 303 | 1640 |
|  | n-, p- | p- | n- |
| 50 min |  | 1774 | 1866 |
|  |  | n- | n- |
| 60 min | 1716 | 1305 | 1387 |
|  | n-, p- | n- | n- |
| 70 min | 1302 | 1877 | 1383 |
|  | n-, p- | p- | p- |
| 80 min | 1314 |  | 1531 |
|  | p- |  | n- |
| 90 min |  |  | 1347 |
|  |  |  | p- |
| 100 min |  |  | 1565 |
|  |  |  | p- |

In this regard it is to be noted that resistivities reported here and elsewhere herein may be easily converted to [B] using calculations known in the art. (See also conversion calculator available online at, for example, www.solecon.com (i.e., www.solecon.com/sra/rho2ccal.htm).

Example 5

TABLE 2

Wafer 04246959 (without pre-anneal); Initial resistivity about 43 ohm-cm; [B] about $3.03 \times 10^{14}$ cm$^{-3}$; [Oi] about $7 \times 10^{17}$ cm$^{-3}$; $T_{calc}$ about 510.4° C.

| Time | 505° C. | 510° C. | 515° C. | 520° C. | 525° C. | 530° C. | 535° C. |
|---|---|---|---|---|---|---|---|
| 30 min |  |  |  |  |  | 61.4 |  |
|  |  |  |  |  |  | p- |  |
| 40 min |  | 86.2 |  |  | 63 |  | 52.4 |
|  |  | p- |  |  | p- |  | p- |
| 50 min |  | 85 | 93 | 73.8 | 77.4 |  | 54.1 |
|  |  | p- | p- | p- | p- |  | p- |
| 60 min | 109 | 132.5 | 153 | 75.4 | 81.5 | 56.3 |  |
|  | p- | n-, p- | p- | p- | p- | p- |  |
| 70 min | 238 | 153 | 120 |  |  |  | 53.8 |
|  | p- | p- | p- |  |  |  | p- |
| 80 min | 2003 | 449 | 635 | 141 | 86.1 | 66.6 |  |
|  | n- | p- | p- | p- | p- | p- |  |
| 90 min | 1733 | 1450 | 1000* | 139 | 103 | 70 |  |
|  | n-, p- | n-, p- | p- | p- | p- | p- |  |
| 100 min | 190 | 942 | 726* | 86.6 | 275 | 65.3 |  |
|  | n- | p- | p- | p- | p- | p- |  |
| 110 min | 48 | 1631 | 107* |  | 1445 |  |  |
|  | n- | n-, p- | n- |  | p- |  |  |
| 120 min |  | 1359 | 26.9* | 80.4 | 80.1 |  |  |
|  |  | p- | n- | n-, p- | p- |  |  |
| 130 min |  | 1810 | 490* | 143 |  |  |  |
|  |  | p- | n- | p- |  |  |  |
| 150 min |  | 250 | 508* |  |  |  |  |
|  |  | n- | p- |  |  |  |  |

Example 6

TABLE 3

Wafer 419DFA-1 (without pre-anneal); Initial resistivity about 225 ohm-cm; [B] about $5.77 \times 10^{13}$ cm$^{-3}$; [Oi] about 9.28 ppma; $T_{calc}$ about 494.6° C.

| Time | 485° C. | 490° C. | 495° C. | 500° C. | 505° C. | 510° C. | 515° C. | 520° C. |
|---|---|---|---|---|---|---|---|---|
| 20 min |  | 496 | 275 |  |  |  |  |  |
|  |  | p- | p- |  |  |  |  |  |
| 40 min |  | 752 | 476 |  |  |  |  |  |
|  |  | p- | p- |  |  |  |  |  |
| 60 min |  | 2775 | 1497 | 231 | 262 | 286 |  |  |
|  |  | p- | p- | p- | p- | p- |  |  |
| 70 min |  | 2310 | 1978 | 450 | 352 | 219 |  |  |
|  |  | p- | p- | p- | p- | p- |  |  |
| 80 min |  |  | 2106 | 263 | 315 | 188 |  |  |
|  |  |  | p- | p- | p- | p- |  |  |
| 90 min |  |  |  | 274 | 419 | 258 |  |  |
|  |  |  |  | p- | p- | p- |  |  |
| 100 min |  |  |  | 293 | 374 | 205 |  |  |
|  |  |  |  | p- | p- | p- |  |  |
| 110 min |  |  |  | 392 | 383 | 211 |  |  |
|  |  |  |  | p- | p- | p- |  |  |
| 120 min |  |  |  | 437 | 560 |  |  |  |
|  |  |  |  | p- | p- |  |  |  |
| 180 min |  |  |  | 423 |  |  |  |  |
|  |  |  |  | p- |  |  |  |  |
| 240 min |  |  |  | 1359 |  |  |  |  |
|  |  |  |  | p- |  |  |  |  |

Example 7

TABLE 4

Wafer 419DFA-2 (without pre-anneal); Initial resistivity about 227 ohm-cm; [B] about $5.72 \times 10^{13}$ cm$^{-3}$; [Oi] about 9.41 ppma; $T_{calc}$ about 495.8° C.

| Time | 485° C. | 490° C. | 495° C. | 500° C. | 505° C. | 510° C. | 515° C. | 520° C. |
|---|---|---|---|---|---|---|---|---|
| 20 min |  | 268 | 402 |  |  |  |  |  |
|  |  | p- | p- |  |  |  |  |  |
| 40 min |  | 588 | 673 |  |  |  |  |  |
|  |  | p- | p- |  |  |  |  |  |
| 60 min |  | 2444 | 1732 | 259 | 322 | 409 |  |  |
|  |  | p- | p- | p- | p- | p- |  |  |
| 70 min |  | 2472 | 1984 | 296 | 447 | 281 |  |  |
|  |  | p- | p- | p- | p- | p- |  |  |
| 80 min |  |  | 1556 | 275 | 375 | 195 |  |  |
|  |  |  | p- | p- | p- | p- |  |  |
| 90 min |  |  |  | 284 | 354 | 288 |  |  |
|  |  |  |  | p- | p- | p- |  |  |
| 100 min |  |  |  | 450 | 360 | 205 |  |  |
|  |  |  |  | p- | p- | p- |  |  |
| 110 min |  |  |  | 310 | 379 | 222 |  |  |
|  |  |  |  | p- | p- | p- |  |  |
| 120 min |  |  |  | 469 | 807 |  |  |  |
|  |  |  |  | p- | p- |  |  |  |
| 180 min = 3 h |  |  |  | 349 |  |  |  |  |
|  |  |  |  | p- |  |  |  |  |
| 240 min = 4 h |  |  |  |  |  | 1793 |  |  |
|  |  |  |  |  |  | p- |  |  |

Example 8

TABLE 5

Wafer MQ0AMMH (without pre-anneal); Initial resistivity about 65 ohm-cm; [B] about $2.00 \times 10^{14}$ cm$^{-3}$; [Oi] about $7.24 \times 10^{17}$ cm$^{-3}$; $T_{calc}$ about 519.1° C.

| Time | 500° C. | 505° C. | 510° C. | 515° C. | 520° C. | 525° C. | 530° C. | 535° C. |
|---|---|---|---|---|---|---|---|---|
| 10 min |  |  | 96.8 | 81.2 |  | 82.5 | 84.1 |  |
| 20 min |  |  | 172.6 p- | 124 p- | 137 |  | 92.9 p- |  |
| 30 min |  |  | 236 p- | 239 p- | 142 p- | 294 p- | 192 p- |  |
| 40 min |  |  | 385 n-,p- | 1015 p- | 193 p- | 290 p- | 160 p- | 122 |
| 50 min |  |  | 174 n-,p- | 87 n- | 1980 p- | 4300 p- | 175 p- | 127.6 p- |
| 60 min |  |  | 44 n- | 50 n- | 2050 p- | 11000 p- | 132.5 p- |  |
| 70 min |  |  | 40 n- | 55.5 n- | 720* p- | 658 n-,p- | p- | 129 |
| 80 min |  |  | 25.7 n- | 23.4 n- | 940* p- | 217 p- | 312 | 186 p- |
| 90 min |  |  | 15.8 n- | 25.5 n- | 52.6 n- | 93 n- | 3630 p- | 408 p- |
| 100 min |  |  |  | 162 n- |  |  | 344 p- | 3260 p- |
| 110 min |  |  |  | 125 n- | 23.8 n- |  |  | 419 p- |

Example 9

TABLE 6

Wafer TR6 (CTSQX003) (without pre-anneal); Initial resistivity about 270 ohm-cm; [B] about $4.81 \times 10^{13}$ cm$^{-3}$; [Oi] about $6.6 \times 10^{17}$ cm$^{-3}$; $T_{calc}$ about 531.3° C.

| Time | 495° C. | 500° C. | 505° C. | 510° C. | 515° C. | 520° C. | 525° C. | 530° C. | 535° C. |
|---|---|---|---|---|---|---|---|---|---|
| 10 min | 1010 | 1035 | 970 | 2400 |  | 830 |  | 490* |  |
| 20 min | p- | p- | p- | 1254 p- |  | 19500 p- |  | 2020 p- |  |
| 30 min |  |  |  | 293 n- |  | 5070 n- |  | 2400* p- |  |
| 40 min |  |  |  | 93.9 n- |  | 786 p- |  | 8600 p- |  |
| 50 min |  |  |  | 99.6 n- |  | 178 n- |  | 7800 p- |  |
| 60 min |  |  |  | 46.5 n- |  | 188 n- |  | 7050 p- |  |
| 70 min |  |  |  | 56.9 n- |  | 379 n- |  | 800 p- |  |
| 80 min |  |  |  | 35.5 n- |  | 64 n- |  | 433 p- |  |
| 90 min |  |  |  | 22.4 n- |  | 74.3 n- |  | 219 n- |  |

Example 10

In this Example the effect of short post-process anneals at about 400° C. on the stability of the high resistivity state was also investigated. Two samples were used in these tests. They were samples made highly resistive by the present process. This was achieved by annealing at about 530° C. (the samples used in this test were similar to the one whose resistivity results were illustrated in FIG. 14: in other words, an initial boron controlled resistivity of about 300 ohm-cm and an oxygen concentration of about 6.6e17 cm$^{-3}$). Following the annealing treatment to create the highly resistive state with this material, one of the samples was p-type and the other n-type. Both were highly resistive, with resistivities in excess of about 1 kohm-cm.

Of interest in this experiment was the stability of the highly resistive state created by the annealing process described here to a further heat treatment. To this end, these samples were subjected to sequential annealing at about 400° C., with the resistivity determined between anneals. The time dependence of the resistivity and the relaxation of the highly resistive state during such anneals was thus determined over annealing times between about 10 and about 60 minutes. These results are summarized in FIG. 17.

Figure 17:
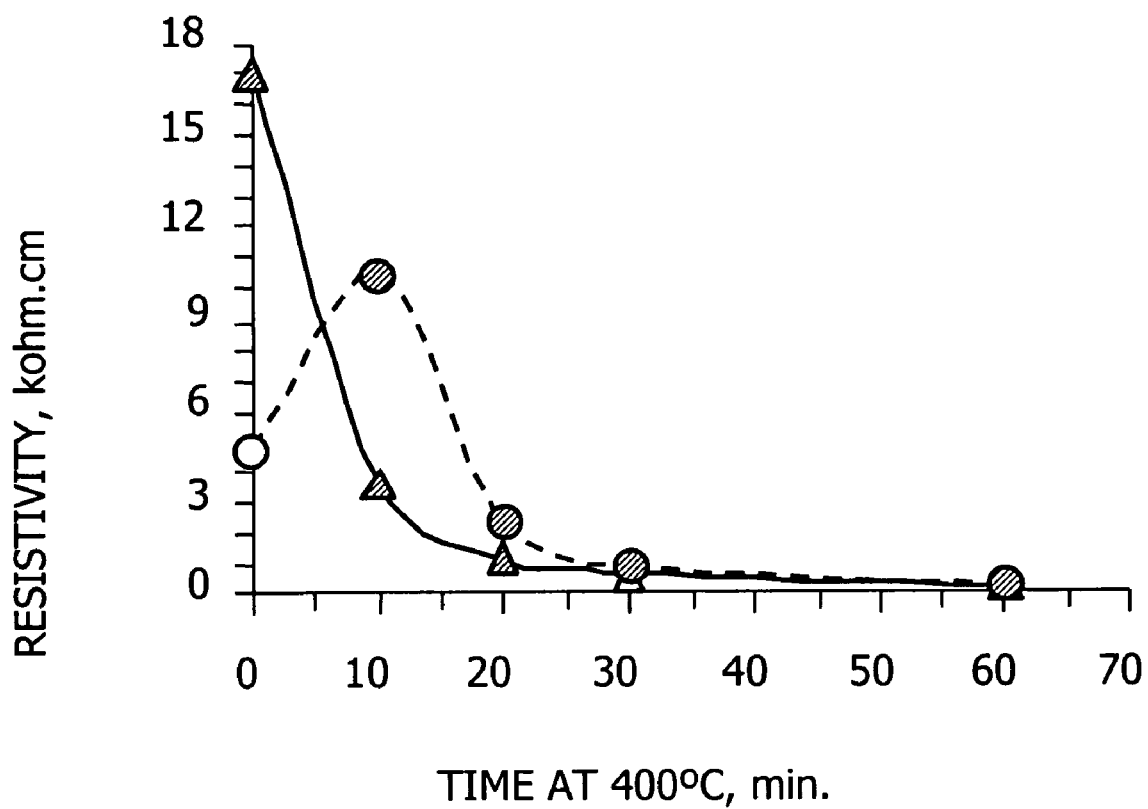
FIG. 17 is a graphical illustration of the effect of a 400° C. anneal on the resistivity of high-resistivity samples. The open symbols correspond to p-type, while the filled symbols correspond to n-type.
Figure 18A:
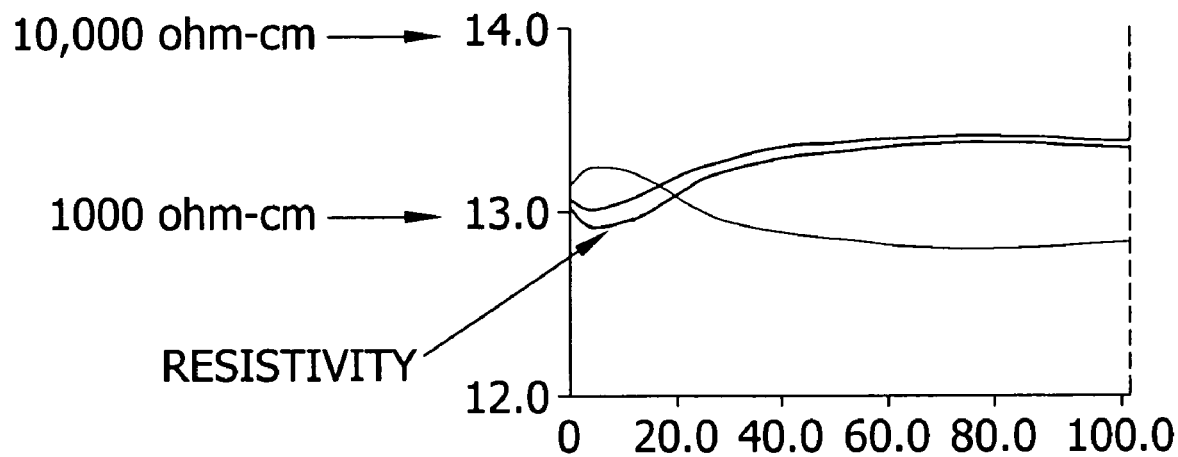
FIG. 18a to 18d are graphical illustrations of the high resistivity states obtained in thermally treated samples having a large [Oi] denuded zone. More specifically, 18a illustrate the results of a treatment at 530° C. only, applied after an 1100° C. outdiffusion anneal.
Figure 18B:
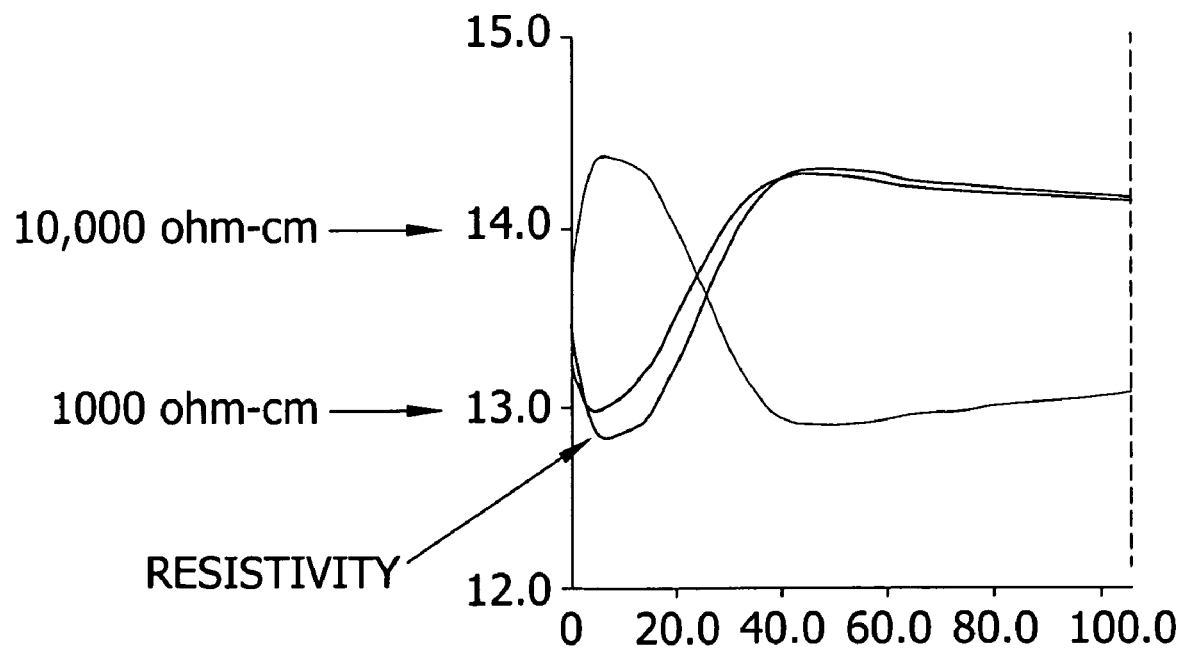
Figure 18C:
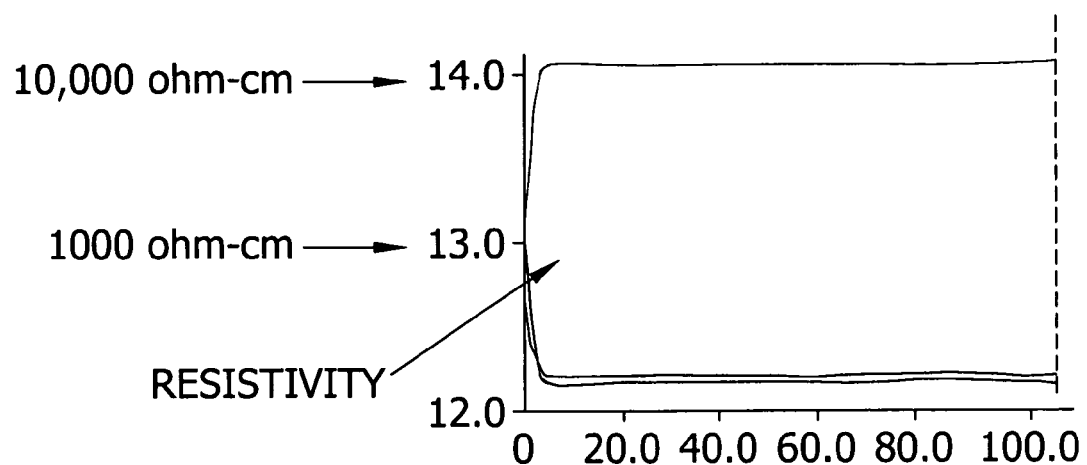
Figure 18D:
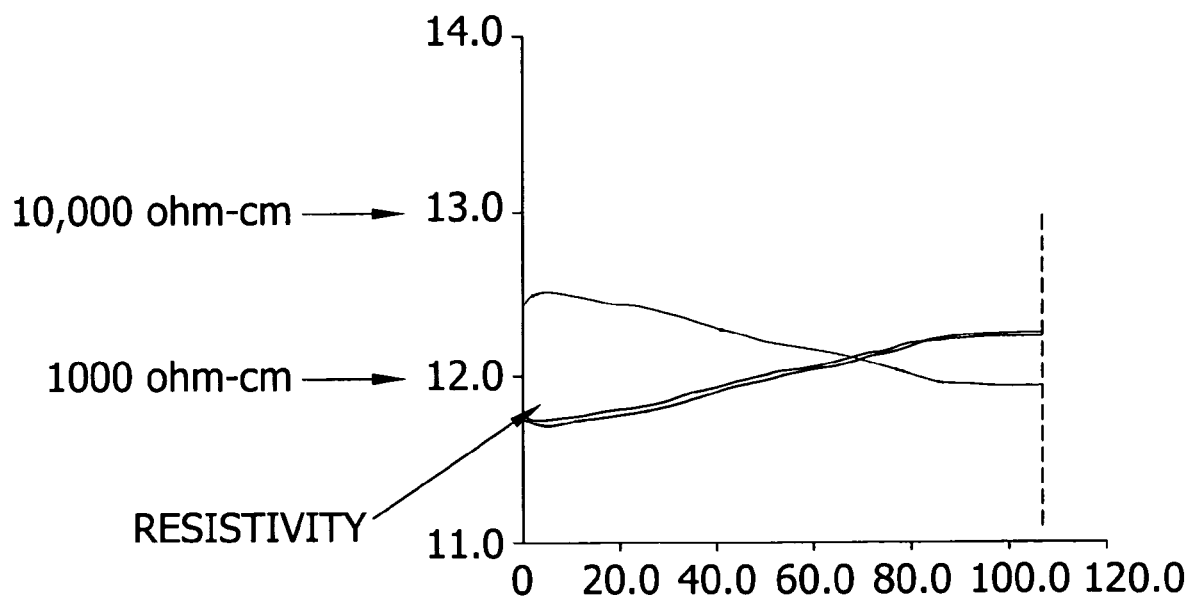

At time equals 0 minutes, the initial value of the high resistivity of the wafers in the test is given. After the shortest anneal (i.e., about 10 minutes) the resistivity still remains high. For initially p-type sample, it is even increased (and the conductivity type is changed to n-type). Further increasing the annealing time led to a gradual reduction in the resistivity. Finally, after about 60 minutes, the resulting samples had a relatively low resistivity, comparable to that of the as-grown material (e.g., about 300 ohm-cm). The conclusion drawn here is that the high resistivity state is preserved after treatments at about 400° C., providing the anneal is not too long (e.g., less than about 60 minutes). For samples CTS-QX003 and 18HLBA-1A, with a moderate boron concentration, a high resistivity was achieved by annealing at about 530° C. The curves in FIG. 17 are for the two different sample, of the opposite achieved conductivity type.

Example 11

In this Example, the effect of an oxygen denuded zone on the on the creation of a high resistivity substrate was examined; that is, the impact of an oxygen out-diffused surface region on the conversion to a high resistivity state was investigated. In this experiment, large amounts of oxygen was out-diffused from a sample containing about 6.6e17 $cm^{-3}$ bulk oxygen by a thermal treatment at about 1100° C. for about 3 hours. The characteristic diffusion length of $2(Dt)^{1/2}$ for this treatment is about 17 microns. The wafer resistivity was about 300 ohm-cm and the desired anneal temperature resulting from this particular combination of oxygen and boron concentrations was determined to be about 530° C.

Samples were annealed with and without the oxygen out-diffusion treatment, and also with and without a 450° C., 3 hour thermal donor pre-anneal inserted between the out diffusion and the high resistivity treatment. A sample description is show below:

| | | 300 mm quarters for resistivity variation tests | | |
|---|---|---|---|---|
| RQ | Quarter scratch | Oi (ppma) Center | Atmosphere | TT |
| 6800 | A | 12.772 | N2 + O2 | 1100° C. 3 h + 40 min 530° C. |
| | B | 12.772 | N2 + O2 | 1100° C. 3 h + 3 h 450° C. + 40 min 530° C. |
| | C | 12.772 | N2 + O2 | 40 min 530° C. |
| | D | 12.772 | N2 + O2 | 3 h 450° C. + 40 min 530° C. |

The results of spreading resistance profiling of the samples following the anneal are shown in the FIGS. 17 A-D.

Examples 12-17

Additional experiments were conducted similar to those detailed in Examples 4-9, above. The details of these experiments (i.e., Examples 12-17) are summarized below:

Example 12

Multiple CZ wafers, or silicon structures comprising a substrate derived from a CZ silicon structure, having interstitial oxygen concentrations of about 12 to about 15 ppma and boron concentrations of about $2.75 \times 10^{14}$ $cm^{-3}$ to about $3.25 \times 10^{14}$ $cm^{-3}$, were heat treated for about 10 to about 100 minutes at about 505 to about 515° C. The resulting wafers, or substrates of said structures, had a resistivity in the range of about 1200 to about 1900 ohm-cm.

Example 13

Multiple CZ wafers, or silicon structures comprising a substrate derived from a CZ silicon structure, having interstitial oxygen concentrations of about 12 to about 15 ppma and boron concentrations of about $2.75 \times 10^{14}$ $cm^{-3}$ to about $3.25 \times 10^{14}$ $cm^{-3}$, were heat treated for about 80 to about 150 minutes at about 500 to about 525° C. The resulting wafers, or substrates of said structures, had a resistivity in the range of about 500 to about 2000 ohm-cm.

Example 14

Multiple CZ wafers, or silicon structures comprising a substrate derived from a CZ silicon structure, having interstitial oxygen concentrations of about 8 to about 12 ppma and boron concentrations of about $5.50 \times 10^{13}$ $cm^{-3}$ to about $6.00 \times 10^{13}$ $cm^{-3}$, were heat treated for about 60 to about 80 minutes at about 490 to about 495° C. The resulting wafers, or substrates of said structures, had a resistivity in the range of about 1500 to about 2800 ohm-cm.

Example 15

Multiple CZ wafers, or silicon structures comprising a substrate derived from a CZ silicon structure, having interstitial oxygen concentrations of about 8 to about 12 ppma and boron concentrations of about $5.50 \times 10^{13}$ $cm^{-3}$ to about $6.00 \times 10^{13}$ $cm^{-3}$, were heat treated for about 60 to about 80 minutes at about 490 to about 495° C. The resulting wafers, or substrates of said structures, had a resistivity in the range of about 1500 to about 2500 ohm-cm.

Example 16

Multiple CZ wafers, or silicon structures comprising a substrate derived from a CZ silicon structure, having interstitial oxygen concentrations of about 6 to about 8 ppma and boron concentrations of about $1.75 \times 10^{14}$ $cm^{-3}$ to about $2.25 \times 10^{14}$ $cm^{-3}$, were heat treated for about 40 to about 110 minutes at about 510 to about 535° C. The resulting wafers, or substrates of said structures, had a resistivity in the range of about 350 to about 11,000 ohm-cm.

Example 17

Multiple CZ wafers, or silicon structures comprising a substrate derived from a CZ silicon structure, having interstitial oxygen concentrations of about 6 to about 8 ppma and boron concentrations of about $4.5 \times 10^{13}$ $cm^{-3}$ to about $5.0 \times 10^{13}$ $cm^{-3}$, were heat treated for about 10 to about 70 minutes at about 495 to about 530° C. The resulting wafers, or substrates of said structures, had a resistivity in the range of about 800 to about 19,500 ohm-cm.

Example 18

In this Example, two groups of CZ wafers were subjected to a high resistivity heat treatment, in accordance with the present invention, in order to illustrate the behavior of groups of wafers. All wafers in this test were first subjected to a 3 hour heat treatment at 450° C. Subsequently, the first group of wafers (Group 1) was annealed together at a temperature established in accordance with Equation (1a) based on their oxygen and boron concentrations (i.e., 530° C. for 30 minutes). The second group of wafers (Group 2) was also annealed together, and also at a temperature established in accordance with Equation (1a) based on their oxygen and boron concentrations (i.e., 510° C. for 30 minutes). The results of this Example are summarized in the Table, below:

| Group/Wafer | Thickness (μm) | [Oi] (ppma) | Resistivity, Initial (ohm-cm) | Resistivity, Final (ohm-cm) |
|---|---|---|---|---|
| 1/A | 676.5 | 15.442 | 105.9 | 5484.0 |
| 1/B | 676.5 | 15.842 | 97.0 | 18904.0 |
| 1/C | 672.5 | 15.535 | 105.8 | 8026.8 |
| 2/A | 714.4 | 10.970 | 184.1 | 4667.0 |
| 2/B | 719.0 | 10.885 | 188.8 | 2383.0 |
| 2/C | 719.2 | 11.041 | 184.6 | 2752.4 |
| 2/C | 716.3 | 10.887 | 182.8 | 1330.8 |

It is to be understood that the above description is intended to be illustrative and not restrictive. Many embodiments will be apparent to those of skill in the art upon reading the above description. The scope of the invention should therefore be determined not with reference to the above description alone, but should be determined with reference to the claims and the full scope of equivalents to which such claims are entitled.

When introducing elements of the present invention or an embodiment thereof, the articles "a", "an", "the" and "said" are intended to mean that there are one or more of the elements. The terms "comprising", "including" and "having" are intended to be inclusive and mean that there may be additional elements other than the listed elements.

The recitation of numerical ranges by endpoints includes all numbers subsumed within that range. For example, a range described as being between 1 and 5 includes 1, 1.6, 2, 2.8, 3, 3.2, 4, 4.75, and 5.

What is claimed is:

1. A process for preparing a high resistivity silicon structure, the process comprising:
    subjecting a silicon structure, which comprises a CZ single crystal silicon substrate having an initial resistivity of at least about 50 ohm-cm, to a heat-treatment for a duration and at a temperature such that the resulting substrate of the heat-treated structure has a concentration of thermal donors [TD] and acceptors [A] wherein the ratio [TD]:[A] is between about 0.8:1 and about 1.2:1.

2. The process of claim 1 wherein said ratio is between about 0.9:1 and 1.1:1.

3. The process of claim 1 wherein the resulting resistivity of the heat-treated substrate is at least about 10 times greater than the resistivity as calculated based on the acceptor concentration therein.

4. The process of claim 1 wherein the substrate of the silicon structure has an oxygen concentration ranging from about at least about 5 to less than about 20 ppma.

5. The process of claim 1 wherein the substrate of the silicon structure has an initial resistivity ranging from at least about 100 to less than about 300 ohm-cm.

6. The process of claim 1 wherein after the heat-treatment the resulting substrate of the heat-treated silicon structure has a resistivity of at least about 1000 ohm-cm.

7. The process of claim 1 wherein boron atoms are the acceptor and oxygen clusters are the thermal donors.

8. The process of claim 7 wherein the boron concentration [B] and the oxygen concentration [Oi] of the substrate of the structure, and the temperature, T, of the heat-treatment, are related by the following equation:

$$[B] = 1e14([O_i]/[O_i]_{ref})^n \exp(E/kT - E/kT_{ref})$$

wherein:
  [B] is the boron concentration;
  $[Oi]_{ref}$ is the reference interstitial oxygen concentration and is about 6.6e17 cm$^{-3}$;
  [Oi] is the actual interstitial oxygen concentration of the substrate of the structure;
  n is the oxygen exponent and is about 7;
  E is the activation energy and is about 4 eV;
  k is the Boltzmann constant;
  T is the actual temperature of the heat-treatment; and,
  $T_{ref}$ is the reference temperature and is about 520° C., and
  further wherein:
  (i) for a given boron concentration, [B], the oxygen concentration may be about +/−0.5 ppma of the calculated concentration and the temperature of the heat-treatment may be about +/−10° C. of the calculated temperature;
  (ii) for a given oxygen concentration, [Oi], the boron concentration may be about +/−20% of the calculated concentration and the temperature of the heat-treatment may be about +/−10° C. of the calculated temperature; and,
  (iii) for a given temperature of the heat-treatment, T, the oxygen concentration may be about +/−0.5 ppma of the calculated concentration and the boron concentration may be about +/−20% of the calculated concentration.

9. The process of claim 1 wherein the substrate of the structure has a front stratum and a back stratum, a circumferential edge, a central axis which is substantially perpendicular to each of said front and back stratums, and a radius extending from said central axis substantially parallel to each of said front and back stratums and toward the circumferential edge, said substrate having an oxygen concentration which varies along said radius.

10. The process of claim 9 wherein said oxygen concentration along said radius varies from about 5 ppma to about 20 ppma.

11. The process of claim 1 wherein the substrate of the structure has a front stratum and a back stratum, a circumferential edge, a central axis which is substantially perpendicular to each of said front and back stratums, and a radius extending from said central axis substantially parallel to each of said front and back stratums and toward the circumferential edge, said substrate having a boron concentration which varies along said radius.

12. The process of claim 11 wherein said boron concentration along said radius varies from at least about 1% to less than about 20%.

13. The process of claim 1 wherein the temperature of said heat-treatment is in the range of greater than about 480 to less than about 600° C.

14. The process of claim 13 wherein said heat-treatment is for a time of about 10 to about 250 minutes.

15. A process for preparing a high resistivity CZ single crystal silicon wafer, the process comprising:
    subjecting a CZ single crystal silicon wafer having a nominal diameter of at least 150 mm and an initial resistivity of at least about 50 ohm-cm to a heat-treatment for a duration and at a temperature such that the resulting heat-treated wafer has a concentration of thermal donors [TD] and acceptors [A] wherein the ratio [TD]:[A] is between about 0.8:1 and about 1.2:1.

16. The process of claim 15 wherein said ratio is between about 0.9:1 and 1.1:1.

17. The process of claim 15 wherein the resulting resistivity of the heat-treated wafer is at least about 10 times greater than the resistivity as calculated based on the acceptor concentration therein.

18. The process of claim 15 wherein said wafer has an oxygen concentration ranging from about at least about 5 to less than about 20 ppma.

19. The process of claim 15 wherein said wafer has an initial resistivity ranging from at least about 100 to less than about 300 ohm-cm.

20. The process of claim 15 wherein said wafer has a resistivity after said heat-treatment of at least about 1000 ohm-cm.

21. The process of claim 15 wherein boron atoms are the acceptor and oxygen clusters are the thermal donors.

22. The process of claim 21 wherein the boron concentration [B] and the oxygen concentration [Oi] of the wafer, and the temperature, T, of the heat-treatment, are related by the following equation:

$$[B]=1e14([O_i]/[O_i]_{ref})^n \exp(E/kT - E/kT_{ref})$$

wherein:

[B] is the boron concentration;

$[Oi]_{ref}$ is the reference interstitial oxygen concentration and is about 6.6e17 cm$^{-3}$;

[Oi] is the actual interstitial oxygen concentration of the wafer;

n is the oxygen exponent and is about 7;

E is the activation energy and is about 4 eV;

k is the Boltzmann constant;

T is the actual temperature of the heat-treatment; and, $T_{ref}$ is the reference temperature and is about 520° C., and further wherein:

(i) for a given boron concentration, [B], the oxygen concentration may be about +/−0.5 ppma of the calculated concentration and the temperature of the heat-treatment may be about +/−10° C. of the calculated temperature;

(ii) for a given oxygen concentration, [Oi], the boron concentration may be about +/−20% of the calculated concentration and the temperature of the heat-treatment may be about +/−10° C. of the calculated temperature; and, (iii) for a given temperature of the heat-treatment, T, the oxygen concentration may be about +/−0.5 ppma of the calculated concentration and the boron concentration may be about +/−20% of the calculated concentration.

23. The process of claim 15 wherein the wafer has a front surface and a back surface, a circumferential edge, a central axis which is substantially perpendicular to each of said front and back surfaces, and a radius extending from said central axis substantially parallel to each of said front and back surfaces and toward the circumferential edge, said wafer having an oxygen concentration which varies along said radius.

24. The process of claim 23 wherein said oxygen concentration along said radius varies from about 5 ppma to about 20 ppma.

25. The process of claim 15 wherein the wafer has a front surface and a back surface, a circumferential edge, a central axis which is substantially perpendicular to each of said front and back surfaces, and a radius extending from said central axis substantially parallel to each of said front and back surfaces and toward the circumferential edge, said wafer having a boron concentration which varies along said radius.

26. The process of claim 25 wherein said boron concentration along said radius varies from at least about 1% to less than about 20%.

27. The process of claim 15 wherein the temperature of said heat-treatment is in the range of greater than about 480 to less than about 600° C.

28. The process of claim 27 wherein said heat-treatment for a time of about 10 to about 250 minutes.

29. A high resistivity silicon structure comprising a CZ single crystal silicon substrate, said substrate having an oxygen concentration between at least about 5 ppma and about 20 ppma, and a concentration of thermal donors [TD] and acceptors [A] wherein the ratio [TD]:[A] is between about 0.8:1 and about 1.2:1.

30. The structure of claim 29 wherein said ratio is between about 0.9:1 and 1.1:1.

31. The structure of claim 29 wherein said structure is an electronic device.

32. The structure of claim 29 wherein said structure is passive electrical device.

33. The structure of claim 29 wherein the substrate of said structure is not Au-doped.

34. The structure of claim 29 wherein the substrate of said structure has a resistivity of at least about 1000 ohm-cm.

35. The structure of claim 29 wherein said structure further comprises an epitaxial layer deposited on a surface of said substrate.

36. The structure of claim 29 wherein said structure is a silicon on insulator structure, said structure further comprising an oxide layer on a surface of said substrate, and a device layer on said oxide layer.

37. The structure of claim 29 wherein boron atoms are the acceptor and wherein oxygen clusters are the thermal donors.

38. The structure of claim 37 wherein the resistivity is substantially greater than the resistivity as calculated based on said boron concentration.

39. The structure of claim 38 wherein the resistivity is at least about 10 times greater than the resistivity as calculated based on the boron concentration.

40. The structure of claim 29 wherein the substrate of the structure has a front stratum and a back stratum, a circumferential edge, a central axis which is substantially perpendicular to each of said front and back stratums, and a radius extending from said central axis substantially parallel to each of said front and back stratums and toward the circumferential edge, said substrate having an oxygen concentration and/or a boron concentration which varies along said radius.

41. The structure of claim 40 wherein said boron concentration along said radius varies from at least about 1% to less than about 20%.

42. The structure of claim 40 wherein said oxygen concentration along said radius varies from at least about 5 ppma to less than about 20 ppma.

43. A high resistivity CZ single crystal silicon wafer, the wafer having a nominal diameter of at least 150 mm and an oxygen concentration between at least about 5 ppma and about 20 ppma, and comprising a concentration of thermal donors [TD] and acceptors [A], wherein the ratio [TD]:[A] is between about 0.8:1 and about 1.2:1.

44. The wafer of claim 43 wherein said ratio is between about 0.9:1 and 1.1:1.

45. The wafer of claim 43 wherein said wafer is not Au-doped.

46. The wafer of claim 43 wherein said wafer has a resistivity of at least about 1000 ohm-cm.

47. The wafer of claim 43 wherein said wafer further comprises an epitaxial layer deposited on a surface of said wafer.

48. A silicon-on-insulator structure comprising the wafer of claim 43 as the handle wafer thereof, said handle wafer having an oxide layer on a surface thereof, and a device layer on a surface of the oxide layer.

49. The wafer of claim 43 wherein boron atoms are the acceptor and wherein oxygen clusters are the thermal donors.

50. The wafer of claim 49 wherein the resistivity is substantially greater than the resistivity as calculated based on said boron concentration.

51. The wafer of claim 50 wherein the resistivity is at least about 10 times greater than the resistivity as calculated based on the boron concentration.

52. The wafer of claim 43 wherein the wafer has a front surface and a back surface, a circumferential edge, a central axis which is substantially perpendicular to each of said front and back surfaces, and a radius extending from said central axis substantially parallel to each of said front and back surfaces and toward the circumferential edge, said wafer having an oxygen concentration and/or a boron concentration which varies along said radius.

53. The wafer of claim 52 wherein said boron concentration along said radius varies from at least about 1% to less than about 20%.

54. The wafer of claim 52 wherein said oxygen concentration along said radius varies from at least about 5 ppma to less than about 20 ppma.

* * * * *